United States Patent
Liu et al.

(10) Patent No.: US 11,862,929 B2
(45) Date of Patent: Jan. 2, 2024

(54) LASER DIODE PACKAGING MODULE, DISTANCE DETECTION DEVICE, AND ELECTRONIC DEVICE

(71) Applicant: SZ DJI TECHNOLOGY CO., LTD., Shenzhen (CN)

(72) Inventors: Xiang Liu, Shenzhen (CN); Guoguang Zheng, Shenzhen (CN); Xiaoping Hong, Shenzhen (CN); Mingyu Wang, Shenzhen (CN); Shuai Dong, Shenzhen (CN)

(73) Assignee: SZ DJI TECHNOLOGY CO., LTD., Shenzhen (CN)

( * ) Notice: Subject to any disclaimer, the term of this patent is extended or adjusted under 35 U.S.C. 154(b) by 306 days.

(21) Appl. No.: 17/165,744

(22) Filed: Feb. 2, 2021

(65) Prior Publication Data
US 2021/0159664 A1     May 27, 2021

Related U.S. Application Data

(63) Continuation of application No. PCT/CN2018/098418, filed on Aug. 3, 2018.

(51) Int. Cl.
*H01S 5/02255*     (2021.01)
*H01S 5/02253*     (2021.01)

(52) U.S. Cl.
CPC ...... *H01S 5/02255* (2021.01); *H01S 5/02253* (2021.01)

(58) Field of Classification Search
USPC .......................................... 372/50.121, 44.01
See application file for complete search history.

(56) References Cited

U.S. PATENT DOCUMENTS

| | | |
|---|---|---|
| 5,875,205 A | 2/1999 | Spaeth et al. |
| 6,501,781 B1 | 12/2002 | Maurer et al. |
| 2011/0158273 A1* | 6/2011 | Okayama ............ H01S 5/02208 372/43.01 |
| 2013/0264946 A1 | 10/2013 | Xu et al. |

(Continued)

FOREIGN PATENT DOCUMENTS

| | | |
|---|---|---|
| CN | 103872230 A | 6/2014 |
| CN | 106469660 A | 3/2017 |

(Continued)

OTHER PUBLICATIONS

The World Intellectual Property Organization (WIPO) International Search Report for PCT/CN2018/098418 dated Apr. 10, 2019 6 pages.

*Primary Examiner* — Tuan N Nguyen
(74) *Attorney, Agent, or Firm* — ANOVA LAW GROUP, PLLC

(57) ABSTRACT

The present disclosure provides a laser diode package module. The laser diode package module includes a substrate including a first surface; a cover disposed on the first surface of the substrate; an accommodation space formed between the substrate and the cover; a laser diode die disposed in the accommodation space; and a reflective surface disposed in the accommodation space for outputting light of the laser diode die reflected by the reflective surface and transmitted through a light-transmitting area. The light-transmitting area is at least partially disposed on a surface of the cover opposite the substrate.

21 Claims, 13 Drawing Sheets

(56) References Cited

U.S. PATENT DOCUMENTS

| | | | | |
|---|---|---|---|---|
| 2013/0272329 A1* | 10/2013 | Auen | ................. | H01S 5/02216 |
| | | | | 372/34 |
| 2015/0185313 A1 | 7/2015 | Zhu | | |
| 2017/0033528 A1* | 2/2017 | Tanisaka | ............. | H01S 5/02326 |

FOREIGN PATENT DOCUMENTS

| DE | 102015217908 A1 | 3/2017 |
|---|---|---|
| EP | 2363686 A1 | 9/2011 |
| JP | H05315700 A | 11/1993 |
| JP | 2000151009 A | 5/2000 |
| JP | 2007065600 A | 3/2007 |
| JP | 2008102282 A | 5/2008 |
| JP | 2019067809 A | 4/2019 |

\* cited by examiner

LASER DIODE PACKAGING MODULE, DISTANCE DETECTION DEVICE, AND ELECTRONIC DEVICE

CROSS-REFERENCE TO RELATED APPLICATION

This application is a continuation application of International Application No. PCT/CN2018/098418, filed on Aug. 3, 2018, the entire content of which is incorporated herein by reference.

TECHNICAL FIELD

The present disclosure generally relates to the field of integrated circuits and, more specifically, to a laser diode packing module, a distance detection device, and an electronic device.

BACKGROUND

Semiconductor laser device and related technology has developed rapidly in recent years. Because of their wide wavelength range, simple production process, and low cost, laser devices are easy to mass produce. Further, because of their compact size, light weight, and long service life, a variety of semiconductor lasers have developed quickly, and their applications are widespread. The most widely used semiconductor lasers are edge emitting lasers (EELS). The laser diode die of the EEL is generally long and narrow. The light-emitting surface is the smallest surface of the die, and the two largest surfaces of the die are metalized surfaces, which are the external electrical connection points.

On the package, in order to ensure the vertical direction of the emitted light, a metal TO package is often used. TO packaging technology refers to the transistor outline or the through-hole packaging technology, that is, a fully enclosed packaging technology. The TO packaged laser has a relatively large parasitic inductance, such that it often cannot generate a narrow pulse in application scenarios that need a narrow pulse. In addition, the mounting efficiency is relatively low, and it is difficult to perform a surface mounted technology (SMT) on an automated machine on the TO packaged laser devices.

Therefore, in order to solve the above technical problems, the laser package needs to be improved.

SUMMARY

One aspect of the present disclosure provides a laser diode package module. The laser diode package module includes a substrate including a first surface; a cover disposed on the first surface of the substrate; an accommodation space formed between the substrate and the cover; a laser diode die disposed in the accommodation space; and a reflective surface disposed in the accommodation space for outputting light of the laser diode die reflected by the reflective surface and transmitted through a light-transmitting area. The light-transmitting area is at least partially disposed on a surface of the cover opposite the substrate.

Another aspect of the present disclosure provides a distance detection device. The distance detection device includes a laser diode package module. The laser diode package module includes a substrate including a first surface; a cover disposed on the first surface of the substrate; an accommodation space formed between the substrate and the cover; a laser diode die disposed in the accommodation space; and a reflective surface disposed in the accommodation space for outputting light of the laser diode die reflected by the reflective surface and transmitted through a light-transmitting area, the light-transmitting area being partially disposed on a surface of the cover opposite the substrate; a collimating lens disposed outside the light-transmitting area for collimating the light emitted from the light-transmitting area; and a first optical path changing element disposed outside the light-transmitting area for changing an optical path of an outgoing light emitted from the light-transmitting area, such that the laser pulse from the laser diode package module is incident on the collimating lens in a direction substantially along a center axis of the collimating lens. The laser diode package module emits laser pulses at an angle from the first surface of the substrate of the laser diode package module, the angle being less than 90 degrees.

DETAILED DESCRIPTION OF THE EMBODIMENTS

Figure 1:
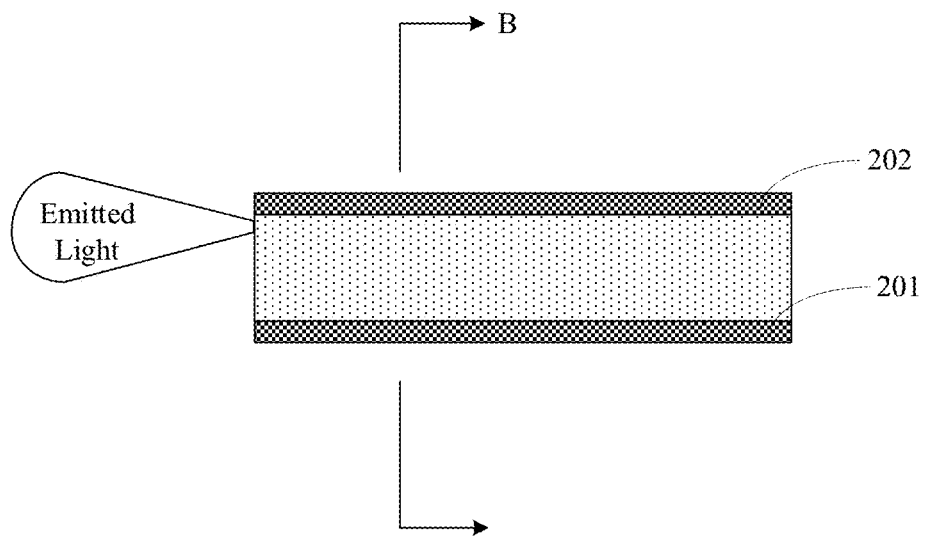
FIG. 1 is a schematic diagram of a structure of a laser diode in a laser diode package module provided in the present disclosure.

In order to make the objectives, technical solutions, and advantages of the present disclosure more clear, the technical solutions in the embodiments of the present disclosure will be described below with reference to the drawings. It will be appreciated that the described embodiments are some rather than all of the embodiments of the present disclosure. It should be understood that the present disclosure is not limited by the example embodiments described herein. Other embodiments conceived by those having ordinary skills in the art on the basis of the described embodiments without inventive efforts should fall within the scope of the present disclosure.

In the following description, numerous specific details are given in order to provide a more thorough understanding of the embodiments of the present disclosure. However, it is obvious to those skilled in the art that the present disclosure can be implemented without one or more of these details. In some embodiments, in order to avoid confusion with the present disclosure, some technical features known in the art are not described.

It should be understood that the present disclosure can be implemented in different forms and should not be construed as being limited to the embodiments presented here. On the contrary, the provision of these embodiments will make the disclosure more thorough and complete, and will fully convey the scope of the present disclosure to those skilled in the art.

The terminology used herein is for the purpose of describing particular embodiments and is not intended to limit the inventive concept. As used herein, the singular forms "a", "an" and "the" are intended to include the plural forms as well, unless the context clearly indicates otherwise. It will be further understood that the terms "includes" and/or "including", when used in this specification, specify the presence of stated features, integers, steps, operations, elements, and/or components, but do not preclude the presence or addition of one or more other features, integers, steps, operations, elements, components, and/or groups thereof. As used herein, the terms "and/or" includes any and all combinations of related listed items.

In order to thoroughly understand the present disclosure, a detailed structured will be provided in the following description to explain the technical solutions provided in the present disclosure. The example embodiments of the present disclosure are described in detail below. However, in addition to these details descriptions, the present disclosure may also have other embodiments.

In order to improve the conventional technology described above, the present disclosure provides a laser diode package module. The package module may include a substrate including a first surface; a cover disposed on the first surface of the substrate, a accommodation space may be formed between the substrate and the cover, where a light-transmitting area may be at least partially disposed on the surface of the cover opposite to the substrate; a laser diode die disposed in the accommodation space; and a reflective surface disposed in the accommodation space, the reflective surface may be used to reflect the emitted light of the laser diode die emit through the light-transmitting area.

The packaging method of the present disclosure can be packaged by substrate packaging with high packaging efficiency, and the packaged die is suitable for the SMT. In addition, in the package module structure of the present disclosure, the pin path is short, and the parasitic inductance is greatly reduced compared with the TO package. Further, the laser diode die emits light from the side surface, and the direction of the emitted light can be substantially parallel to the first surface of the substrate. A reflective surface can be disposed on the propagation path of the emitted light of the laser diode die, and the emitted light can be reflected and emitted from the light-transmitting area on the cover, thereby changing the propagation direction of the light beam. Since the reflective surface is added to the propagation path of the emitted light, the bottom surface of the laser diode die may be mounted in the accommodation space, and the emitted light beam can be emitted in a direction substantially perpendicular to the first surface. In addition, the area of the bottom surface of the laser diode die is relatively large, which can facilitate the placement of the die and the position of the package module in the whole device.

First Embodiment

A specific embodiment of the laser diode package module of the present disclosure will be described in detail below with reference to FIG. 1, FIG. 2, FIGS. 3A-3D, and FIGS. 4A-4I.

Figure 4A:
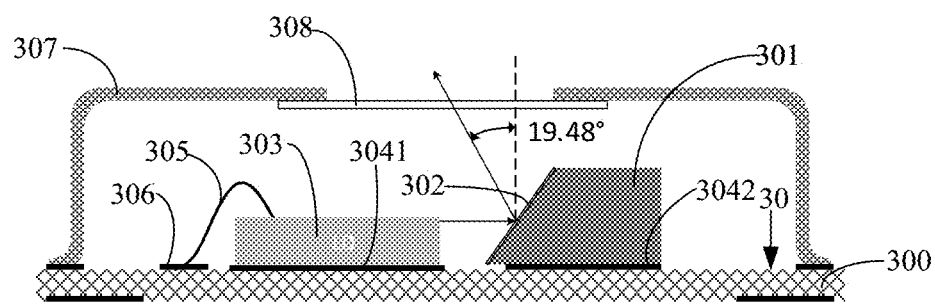
FIG. 4A is a cross-sectional view of the laser diode package structure according to an embodiment of the present disclosure.
Figure 4B:
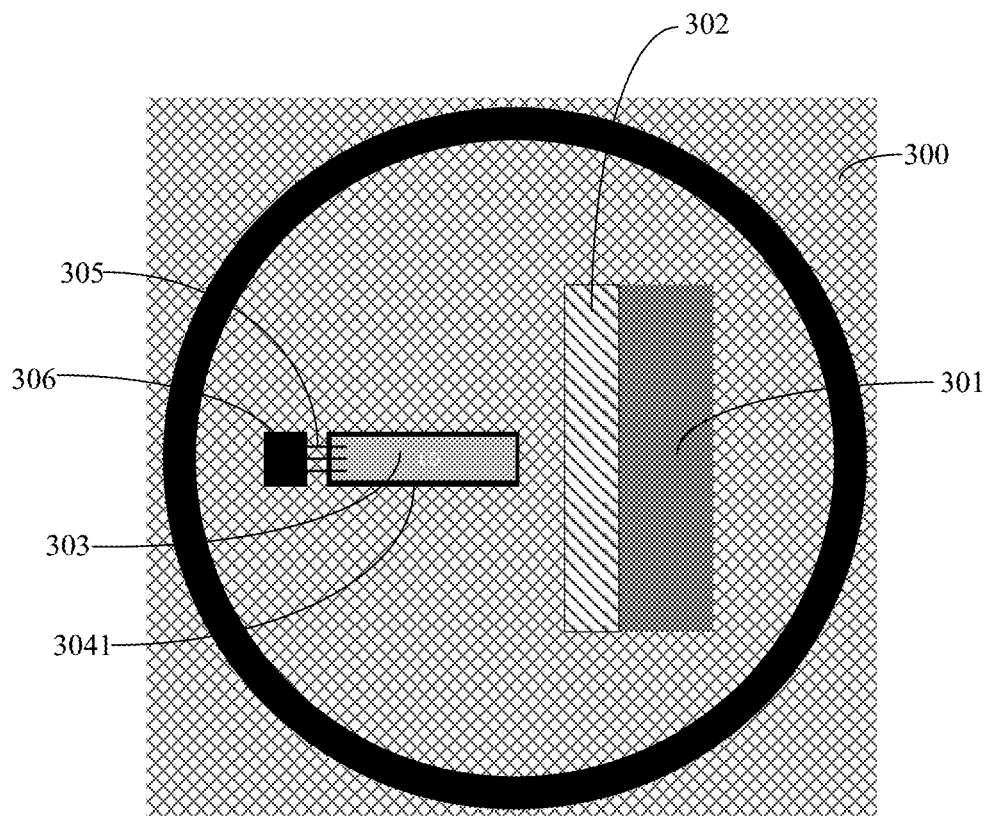
FIG. 4B is a top view of the laser diode package module structure in FIG. 4A after a cover is removed.

FIG. 4A is a cross-sectional view of the laser diode package structure according to an embodiment of the present disclosure, and FIG. 4B is a top view of the laser diode package module structure in FIG. 4A after the cover is removed. In one embodiment, the laser diode package module structure of the present disclosure includes a substrate 300 including a first surface 30.

The substrate 300 may include various types of substrates, such as a printed circuit board (PCB) substrate, a ceramic substrate, a pre-mold substrate, etc. The ceramic substrate may be an aluminum nitride or an alumina substrate.

The PCB may be made of different components and a variety of complex process technologies. The structure of the PCB may include a single-layer, double-layer, multi-layer structure, and different hierarchical structure may have different manufacturing methods.

In some embodiments, the PCB is mainly composed of pads, through holes, mounting holes, wires, components, connectors, filing, electrical boundaries, etc.

Further, the conventional layer structures of the PCB includes single-layer PCB, double-layer PCB, and multi-layer PCB. The specific structures are described below.

(1) Single-layer PBC: a circuit board with copper on one side and no copper on the other side. Generally the components are placed on the side without copper, and the side with copper is mainly used for wiring the welding.

(2) Double-layer PCB: a circuit with copper on both sides. Generally one side is called the top layer, and the other side is call the bottom layer. Generally, the top layer is used as the surface for placing components and the bottom layer is used as the welding surface for components.

(3) Multi-layer PCB: a circuit board including multiple working layers. In addition to the top and bottom layers, it also includes several intermediate layers. Generally the intermediate layers can be used as a wiring layer, signal layer, power layer, ground layer, etc. The layers are insulated from each other, and the connection between the layers is generally achieved via through holes.

The PCB may include many types of working layers, such as the signal layer, protective layer, silk screen layer, internal layer, etc., which will not be repeated here.

In addition, the substrate described in the present disclosure may also be a ceramic substrate. The ceramic substrate may refer to a special processed board in which copper foil is directly bonded to alumina ($Al_2O_3$) or aluminum nitride (AlN) ceramic substrate surface (single-sided or double-sided) at a high temperature. The ultra-thin composite substrate from this process has excellent electrical insulation properties, high thermal conductivity, excellent solderability, and high adhesion strength, and can be etched into various patterns like a PCB board, and has a large current-carrying capacity.

Further, the substrate may be a pre-mold substrate. The pre-mold substrate may include injection molded wires and pins, and the injection molded wires may be embedded in the main structure of the substrate. The pins may be positioned on the surface of the main structure of the substrate, such as the inner surface and/or the outer surface, to realize the electrical connection between the substrate and the laser diode die, the driving chip, and the circuit board, respectively.

The preparation method of the pre-mold substrate may include a conventional injection process, planer excavation process, and molding process, which will not be repeated here.

The injection material of the pre-mold substrate may be a conventional material, such as a thermally conductive plastic material, etc., and is not limited to a certain type of material. The shape of the pre-mold substrate is limited by the injection frame, and is not limited to a certain type of shape.

In addition, the laser diode package module structure may further include a laser diode die 303, which may be disposed in the accommodation space. In some embodiments, the laser diode die 303 may be mounted on the first surface 30 of the substrate 300.

Figure 2:
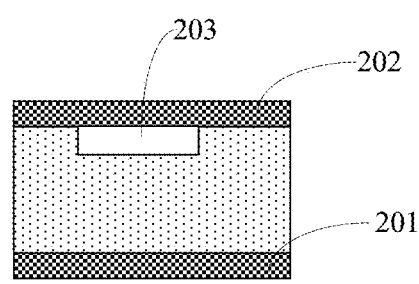
FIG. 2 is a cross-sectional view of the laser diode of FIG. 1 along a B-B direction.

As an example, the laser diode die 303 may be a side laser, that is, the side of the laser diode die can emit light. A structure of the laser diode die is shown in FIG. 1 and FIG. 2. FIG. 1 is a schematic diagram of a structure of a laser diode in a laser diode package module provided in the present disclosure, and FIG. 2 is a cross-sectional view of the laser diode of FIG. 1 along a B-B direction. The laser diode die includes a first electrode 201 and a second electrode 202 disposed opposite to each other, and the surface on which the first electrode 201 is positioned is mounted on the first surface of the substrate.

In some embodiments, the first electrode 201 and the second electrode 202 may both be metalized electrodes. The first electrode 201 may be disposed on the bottom surface of the laser diode die, and the first electrode 201 may be an n-electrode. The second electrode 202 may be disposed on the top surface of the laser diode die, and the second electrode 202 may be a p-electrode.

In one example, as shown in FIG. 4A, the first electrode of the laser diode die 303 is mounted on the first surface of the substrate through a conductive adhesive layer, such as being mounted on a substrate metal layer 3041 corresponding to the first surface 30 of the substrate 300.

The laser diode die 303 may be a bare die, that is, a small piece of circuited "die" cut from a wafer, which is mounted on the substrate 300 by means of die bond. Die bond may refer to the process of bonding the die to a designated are of the substrate through glue, generally a conductive glue or an insulating glue, to form a thermal path or an electrical path to provide conditions for the subsequent wire bonding. In this embodiment, the first surface of the substrate is covered with a patterned metal layer. For example, as shown in FIGS. 4A and 4B, a substrate metal layer 3041 is disposed on the first surface 30 of the substrate 300 for electrical connection with the laser diode die 303, A pattern may be formed on the substrate metal layer 3041 by etching the copper foil on the ceramic substrate. These substrate metal layers may also be used as alignment marks in the process of mounting various devices on the substrate.

Figure 4C:
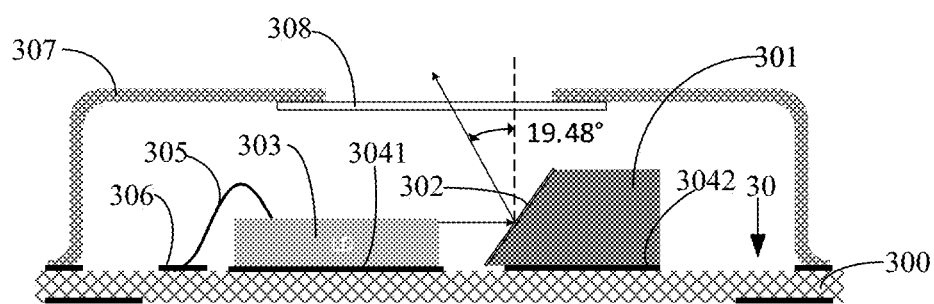
FIG. 4C is a cross-sectional view of the laser diode package structure according to another embodiment of the present disclosure.
Figure 4D:
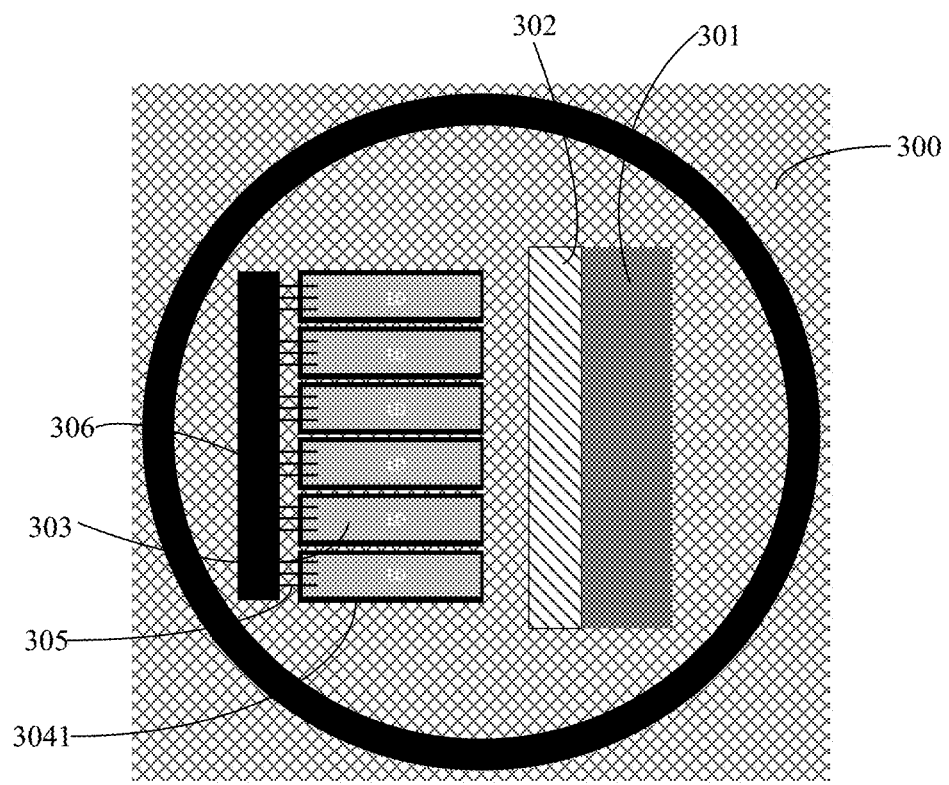
FIG. 4D is a top view of the laser diode package module structure in FIG. 4C after the cover is removed.

As an example, as shown in FIGS. 4C and 4D, a plurality of laser diode dies 303 are mounted on the first surface of the substrate, each laser diode die 303 corresponds to a substrate metal layer 3041, and the substrate metal layers 3041 are isolated from each other. The substrate metal layer 3041 of the substrate may also be used to lead out electrodes of the laser diode die 303 positioned on the bottom surface to facilitate electrical connection with other devices. Further, the first electrode of each laser diode die 303 (that is, the electrode mounted on the substrate, also called the electrode on the bottom surface of the laser diode die) may be mounted on the first surface of the substrate corresponding to a conductive adhesive layer (not shown in FIGS. 4C and 4D), such as being mounted on the corresponding substrate metal layer 3041 on the first surface 30 of the substrate 300. In addition, the adjacent conductive adhesive layers may be isolated from each other to prevent the electrodes on the bottom surface of the laser diode die from being electrical connected.

In one example, the area of the conductive adhesive layer may be larger than the area of the bottom surface of the laser diode die; and/or the conductive adhesive layer may be electrically connected to a pad on the substrate through a wire to lead out the first electrode.

In this embodiment, an electrical path may be formed by mounting the laser diode die 303 on the substrate through a conductive adhesive layer (not shown in FIGs). The material of the conductive adhesive layer (not shown in FIGs) may include a conductive silver paste, a solder, or a conductive die attach film (DAF). The conductive silver paste may be an ordinary silver paste or a nano-silver paste. The solder may include, but is not limited to AuSn20. In some embodiments, in order to ensure the placement accuracy and high heat dissipation, AuSn20 eutectic may be used for mounting. Since a solder such as AuSn20 is used as the conductive adhesive layer, it is basically non-volatile or low-volatile compared to other solders including volatile flux (such as a tin solder paste), therefore, the light output efficiency of the laser diode die will not be affected due to the volatile substances in the solder polluting the laser diode die and the reflective surface.

In one example, the second electrode may be electrically connected to the substrate through a wire 305, for example, the second electrode (e.g., a p-electrode) may be electrically connected to a pad 306 disposed on the substrate through the wire 305. In some embodiments, the wire 305 may be a metal wire, such as a gold wire. The diameter of the gold wire may be about 1 mil (25.4 micrometer) or other suitable diameter, and the number of the wires 305 can be set reasonably based on actual needs. A plurality of wires may be used side by side to realize the electrical connection between the second electrode and the pad, and the wire arc may be pulled as low as possible.

In one example, the shape of the laser diode die may be a column structure, for example, it may be a cuboid, a polyhedron, a column, or other suitable shapes, which will not be listed here. The exit surface of the laser diode die may be disposed on the side surface of one side of the cuboid structure of the laser diode die, and the side surface may be the smallest surface of the laser diode die. Further, the bottom surface of the laser diode die may be mounted in the accommodation space, where the area of the bottom surface of the laser diode die maybe relatively large, for example, larger than the area of the exit surface. In some embodiments, the bottom surface of the laser diode die may be mounted on the first surface of the substrate, and the side of the laser diode die may emit light. Due to the arrangement of the reflective surface, the bottom surface of the laser diode die may be mounted in the accommodation space and the emitting light may be emitted in a direction substantially perpendicular to the first surface. The area of the bottom surface of the laser diode die may be relative large, which is convenient for the placement of the die, and it is also convenient for the position setting of the package module in the whole device.

In a specific embodiment, the laser diode die may have a cuboid structure, and the exit surface of the laser diode die may refer to the side surface of one side of the cuboid structure. As shown in FIG. 1, the exit surface of the laser diode die is the side surface at the left side of the cuboid structure, where a light-emitting area 203 is disposed under the second electrode, and the light-emitting area 203 is close to the second electrode 202, as shown in FIG. 2.

It should be noted that exit surface (also referred to as the light-emitting surface) may refer to the surface of the laser diode die emitting light. The exit surface may also be the side surface of the right side of the laser diode die, it may also be the front surface and rear surface of the laser diode die, and is not limited to the above example.

As an example, the laser diode package module structure of the present disclosure may further include a reflective surface, which may be disposed in the accommodation space for making the emitting light of the laser diode die reflected by the reflective surface to emit through the light-transmitting area. In some embodiments, the emitted light of the laser diode die may be reflected by the reflective surface, and then emitted through the light-transmitting area in a direction substantially perpendicular to the first surface of the substrate.

In one example, the package module may also include a semiconductor with an anisotropic structure. The semiconductor with an anisotropic structure may include, but is not limited to silicon, and may also be other semiconductor materials, such as germanium and III-V group (such as GaAs) compound semiconductors. In some embodiments, the semiconductor may include a semiconductor wafer, such as a single crystal silicon wafer.

Figure 3A:
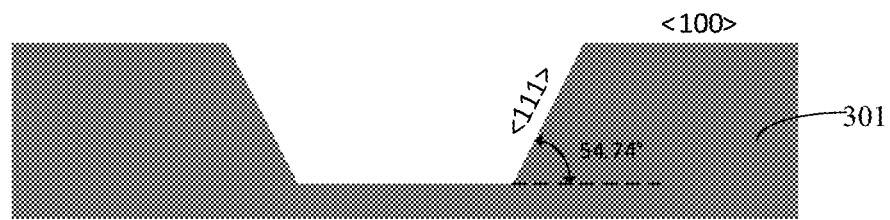
FIG. 3A is a schematic cross-sectional view of a silicon wafer after etching using anisotropy according to an embodiment of the present disclosure.
Figure 3B:
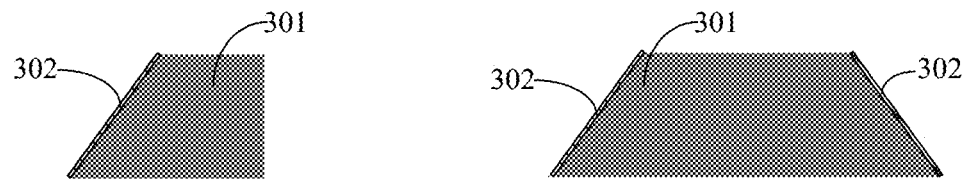
FIG. 3B is a schematic cross-sectional view of the silicon wafer with a reflective surface disposed on an inclined surface according to an embodiment of the present disclosure, where the left image is the silicon wafer with one included surface, and the right image is the silicon wafer with two inclined surfaces.

In one example, the reflective surface may specifically be an inclined surface prepared by etching the semiconductor using anisotropy. Since the semiconductor itself has the function of reflecting light, the inclined surface of the semiconductor may be directly used as the reflective surface. As an example, as shown in FIGS. 3A and 3B, the semiconductor is a silicon wafer 301. The material of the semiconductor, silicon, has anisotropic characteristics due to its diamond cubic lattice structure, and has anisotropic characteristics in terms of etching. As shown in FIG. 3A, a crystal orientation <100> of the silicon wafer 301 and a crystal orientation <111> form an angle of 54.74°. Since the angle is determined by the material lattice structure, it will not change with the fluctuation of the parameters of the production process, therefore, the angle of the inclined plane prepared from the silicon wafer is basically 54.74°. Any suitable etchant may be used for the etching, for example, an inorganic alkali solution or an organic alkali solution may be used as the etchant. The inorganic alkaline solutions may include, but are not limited to KOH, and the organic alkaline solutions may include, but are not limited to tetramethyl-ammonium hydroxide (TMAH).

Further, the semiconductor may be etched using anisotropy to obtain at least one inclined surface. In one example, at least two obliquely arranged reflective surfaces may be disposed on different inclined surfaces prepared by etching the semiconductor using anisotropy. Taking the silicon wafer as an example, as shown in FIGS. 3A and 3B, the silicon wafer 301 is etched using anisotropy to prepare an inclined surface, and at least one inclined surface can be prepared by a suitable etching method, for example, by etching through the upper and lower surfaces of the silicon wafer to form the structure shown in FIG. 3B. The left image of FIG. 3B shows a silicon wafer 301 with one inclined surface, or the right image of FIG. 3B shows a silicon wafer 301 with two opposite inclined surfaces. The cross-sectional shape of the semiconductor (such as the silicon wafer 301) may be a right-angled trapezoid or an isosceles trapezoid.

The reflective surface mentioned in the present disclosure may be disposed on different inclined surfaces prepared by etching the semiconductor using anisotropy may refer to directly using the inclined surface of the semiconductor (such as a silicon wafer) as the reflective surface, or the reflective surface may include a reflective film coated on an inclined surface prepared by etching the semiconductor using anisotropy. For light beams with wavelengths between 300 and 1200 nm, the quantum efficiency absorbed by a monocrystalline silicon can exceed 50%. In one embodiment, the wavelength of the light beam emitted by the laser diode die may be about 905 nm. Within this range, the reflectivity of the monocrystalline silicon is approximately 70%. In some embodiments, in the case of using the monocrystalline silicon as a semiconductor, in order to improve the reflectivity, a reflectivity film may be coated on the inclined surface of the monocrystalline silicon. For example, as shown in FIG. 3B, a reflective film 302 is coated on the inclined surface prepared by etching the silicon wafer 301 using anisotropy to increase the reflectivity of the reflective surface, thereby increasing the output power of the laser. The material of the reflective film 302 may include any suitable metal material that can reflect light. For example, the reflective film 302 may include at least one of gold, silver, and aluminum, where the reflectivity of gold or silver to the light beam with a wavelength of 905 nm is above 95%. A deposition method such as vacuum evaporation can be used to form the reflective film 302 on the inclined surface of the semiconductor.

During the die bond process, due to the downward pressure, the sharp corners of the bottom of the semiconductor (such as the silicon wafer 301 shown in FIG. 3B) may be relatively thin, and there may be a risk of corner chipping, which will cause the inclined surface to break near the bottom and generate debris. In order to avoid the corner chipping effect described above, a notch or a groove may be provided at the sharp corners of the bottom surface of the semiconductor. Since the size and formation position of the predetermined notch or shallow groove are more controllable then the chipping formed by the downward pressure, it can be ensured that the reflective surface can receive all the light spots emitted from the laser diode die without the corner chipping effect.

Figure 3C:
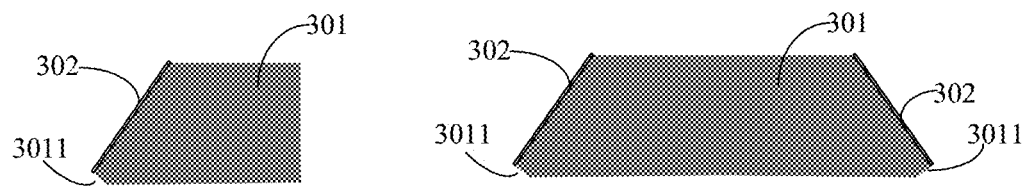
FIG. 3C is a schematic cross-sectional view of the silicon wafer disposed on the notches of the sharp corners of a bottom surface according to an embodiment of the present disclosure.
Figure 3D:
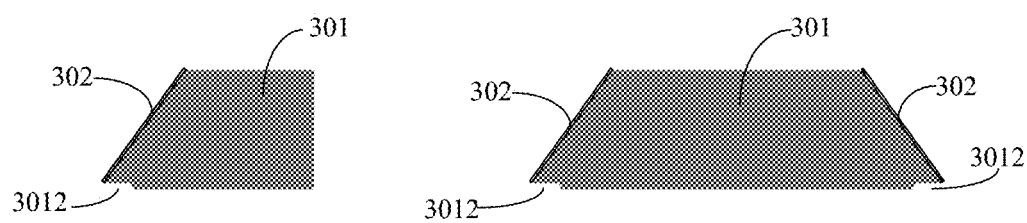
FIG. 3D is a schematic cross-sectional view of the silicon wafer disposed on the shallow grooves of the sharp corners of the bottom surface according to an embodiment of the present disclosure.

In one example, as shown in FIG. 3C, a plurality of notches 3011 are disposed at the sharp corners of the bottom surface of the semiconductor (e.g., the silicon wafer 301). In some embodiments, the notch may specifically be a notch formed by removing a part of the bottom corner of the semiconductor, and a part of the bottom corner can be removed by etching. The etching may use a conventional dry etching process, such as reactive ion etching, ion beam etching, plasma etching, laser ablation, or any combination of these methods. A single etching method may be used, or more than one etching method may be used. In another example, as shown in FIG. 3D, a plurality of shallow grooves 3012 are disposed at the sharp corners of the bottom surface of the semiconductor (e.g., the silicon wafer 301). In some embodiments, the shallow groove 3012 may be provided at the edge of the sharp corner of the bottom surface and recess at a depth from the bottom surface of the semiconductor to the top surface of the semiconductor. The shallow groove 3012 may be formed by an etching method including, but is not limited to wet etching or dry etching. In one example, the method of forming the shallow groove may include forming a mask, such as a photoresist, on the bottom surface of the semiconductor; defining a predetermined pattern of shallow groove in the photoresist through a photolithography process; using the photoresist layer as a mask; etching the semiconductor from the bottom surface to from the shallow groove 3012; and removing the photoresist layer at the end.

In one example, an obliquely disposed reflectivity surface may be disposed in the package module. For example, as shown in FIGS. 4A and 4B, the reflective surface includes a reflective film 302 coated on an inclined surface prepared by etching the semiconductor (e.g., the silicon wafer 301) using anisotropy. The reflective surface is disposed opposite to the exit surface of the laser diode die 303, such that the exit light of the laser diode die 303 may be reflected by the reflective surface and then emitted through the light-transmitting area. When the angle between the reflective surface and the bottom surface of the semiconductor (e.g., the silicon wafer 301) is substantially 54.74°, the emitted light of the laser diode die 303 may be reflected by the reflective surface and then emitted through the light-transmitting area at an angle substantially 19.48 to the normal of the substrate.

In another example, as shown in FIGS. 4C and 4D, an obliquely disposed reflectivity surface is disposed in the package module. The reflective surface includes a reflective film 302 coated on an inclined surface prepared by etching the semiconductor (e.g., the silicon wafer 301) using anisotropy. The reflective surface is disposed opposite to the exit surfaces of at least two laser diode dies 303 disposed side by side, such that the exit light of each laser diode die 303 may be reflected by the For example, and then emitted though the light-transmitting area, thereby realizing the 1×N one-dimensional multi-line package structure, where N is greater than or equal to 2.

In this embodiment, the semiconductor (e.g., the silicon wafer 301) is mounted on the first surface 30 of the substrate 300 through an adhesive layer (not shown in FIGs). For example, a substrate metal layer 3042 corresponding to the semiconductor may be disposed on the first surface 30 of the substrate 300, and the semiconductor may be attached to the surface of the substrate metal layer 3042 on the first surface 30 of the substrate through an adhesive layer.

The material of the adhesive layer may use the same material as the conductive adhesive layer described above. The material of the conductive adhesive layer (not shown in FIGs) may include a conductive silver paste, a solder, or a conductive die attach film (DAF), where the conductive silver paste may be an ordinary silver paste or a nano-silver paste. The solder may include, but is not limited to AuSn20. In some embodiments, in order to ensure the placement accuracy and high heat dissipation, AuSn20 eutectic may be used for mounting. In one example, the method of using AuSn eutectic for die bond may include the following processes of bonding the backside of the semiconductor and the surface of the substrate metal layer, where the substrate metal layer 3042 may be an AuSn alloy; providing gold at the back surface of the semiconductor; and heating for form an alloy between the gold on the back surface of the semiconductor and the substrate metal layer, which plays the role of fixing the semiconductor on the first surface of the substrate and making a good electrical connection.

In another example, the adhesive layer may include an adhesive glue. The adhesive glue may be coated on the position where the semiconductor is scheduled to be placed on the substrate. Then the semiconductor may be placed on the adhesive glue. Subsequently, baking and curing may be performed, such that the semiconductor may be mounted on the first surface of the substrate.

Further, as shown in FIG. 4D, a plurality of laser diode dies 303 are mounted on the first surface of the substrate 300. The first electrode (e.g., an n-electrode) of each laser diode die 303 corresponds to a substrate metal layer 3041 and is mounted on the first surface of the substrate 300, and adjacent substrate metal layers 3041 are isolated from each other.

In one example, as shown in FIG. 4D, the second electrodes (e.g., a p-electrode) of the plurality of laser diode dies 303 opposite to the same reflective surface are electrically connected to the same pad 306 on the substrate 300 through the wires 305. The pad 306 has a long strip shape and is disposed on the outside of the surface of the laser diode die 303 opposite to the exit surface. The material of the pad 306 may include aluminum or other suitable metal materials.

In one example, the package module may include a semiconductor with an anisotropy structure, and at least two obliquely disposed reflective surfaces may be disposed on different inclined surfaces prepared by etching the semiconductor using anisotropy. For example, as shown in the right image of FIG. 3B, two obliquely disposed reflective surfaces are disposed on opposite oblique surfaces which are symmetrically disposed on the semiconductor (e.g., the silicon wafer 301). Alternatively, two obliquely disposed reflective surfaces may also be disposed on two adjacent oblique surfaces on the semiconductor.

In one example, at least two obliquely disposed reflective surfaces may be disposed in the package module, and each reflective surface may be disposed opposite to the exit surface of at least one of the laser diode dies, such that the emitted light of each laser diode die may be reflected by the reflective surface and emitted through the light-transmitting area.

Figure 4E:
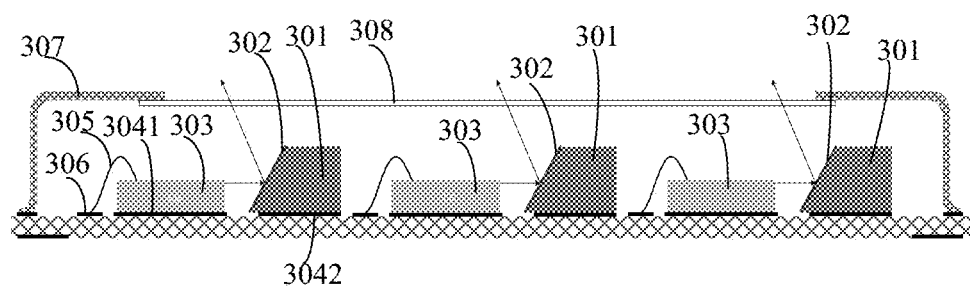
FIG. 4E is a cross-sectional view of the laser diode package structure according to yet another embodiment of the present disclosure.

In one specific example, the package module may include at least two semiconductors with an anisotropic structure, and at least two obliquely disposed reflective surfaces may be respectively disposed on the inclined surfaces prepared by etching different semiconductors using anisotropy. The different semiconductors may be disposed on the substrate in any suitable arrangement, and the semiconductors may be spaced apart from each other and disposed in rows on the substrate. For example, taking the silicon wafer as an example, as shown in FIG. 4E, the package module includes three silicon wafers 301 with an anisotropic structure, and three obliquely disposed reflective surfaces are respectively disposed on different oblique surfaces prepared by anisotropic etching of different silicon wafers 301.

Figure 4F:
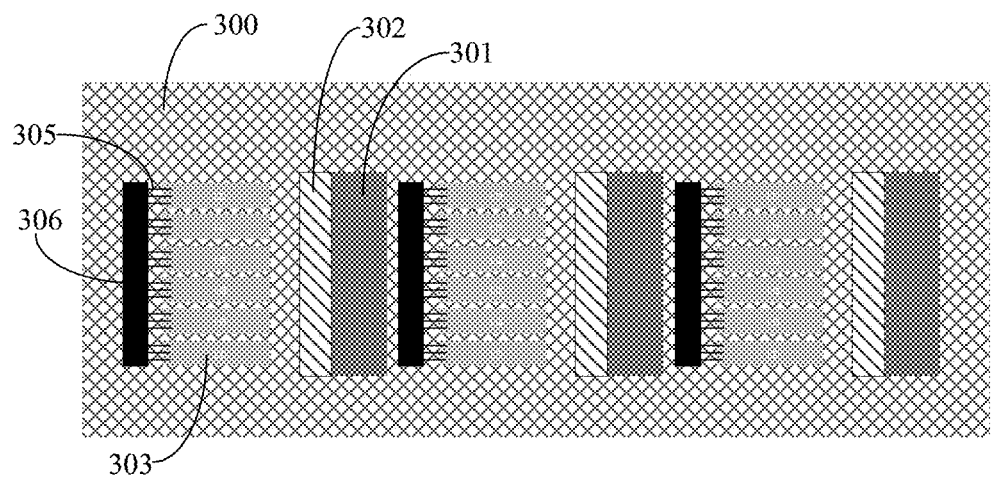
FIG. 4F is a top view of the laser diode package module structure in FIG. 4E after the cover is removed.

Further, each of the reflective surfaces may be disposed opposite to the exit surfaces of at least two laser diode dies 303 arranged in parallel, such that the exit light of each laser diode die may be reflected by the reflective surface and emitted through the light-transmitting area, thereby realizing an M×N two-dimensional multi-line package. For example, as shown in FIGS. 4E and 4F, each reflective surface is disposed opposite to the emitting surface of six laser diode dies 303 disposed side by side, such that the emitted light of each laser diode die may be reflected by the reflective surface and emitted through the light-transmitting area. The number of laser diode dies 303 facing the same reflective surface can be reasonably selected based on the needs of the actual device. It should be noted that that only a semiconductor with one inclined surface is shown in FIG. 4F, and the semiconductor may also be a semiconductor with at least two inclined surfaces.

A plurality of laser diode dies 303 opposite to the same reflective surface may be arranged in any suitable interval on the first surface of the substrate. In some embodiments, as shown in FIG. 4F, a plurality of laser diode dies 303 opposite to the same reflective surface are arranged at equal intervals on the first surface of the substrate 300, such that the emitted lights of different laser diode dies 303 reflected by the reflective surface may be emitted at different intervals. When the package module of the present disclosure is applied to a lidar, each light emitted from the light-transmitting area needs to correspond to each receiver in a one-to-one correspondence. That is, a part of the laser light emitted by each laser diode die is reflected by the object to return to the corresponding receiver. As such, the transmitting and receiving positions need to be calibrated to make them correspond one-to-one. Therefore, the laser diode dies 303 are arranged at equal intervals, which is more convenient for the arrangement of the receivers.

The distance between the exit surface of the laser diode die opposite to the same reflective surface and the reflective surface may be reasonably set based on the needs of the specific device. In some embodiments, as shown in FIG. 4F, the distance between the exit surface of each laser diode die 303 opposite to the same reflective surface and the reflective surface is equal, thereby ensuring the general consistency of the light of each laser diode die reaching the reflective surface.

In the technical solutions of the present disclosure, in some embodiments, as shown in FIGS. 4A and 4B, the direction of the emitted light of the laser diode die 303 is perpendicular to the bottom side of the reflective surface and parallel to the first surface of the substrate. The reflective surface is quadrilateral, and the side adjacent to and parallel to the first surface of the substrate serves as the bottom side.

The light beam emitted from the laser diode die may be an elliptical spot. The divergence angle of the light beam along the direction perpendicular to the first surface of the substrate (herein referred to as the y direction) is large, which can be referred to as the fast axis, and the divergence angle of the light beam along the x direction (where the x direction is perpendicular to the y direction) is small, which can be referred to as the slow axis. Due to the difference in the light beam waist and divergence angle of the fast and slow axes, the light beam quality BPP of the fast and slow axes of the semiconductor laser can be very different. Therefore, the package module of the present disclosure may also include a collimating element for collimating the light beam, reducing the divergence angle of the light beam in the fast axis direction, or reducing the divergence angle of the light beam in the slow axis direction. The collimating element may be disposed between the laser diode die and the reflective surface, such that the emitted light from the laser diode die can reach the reflective surface after passing through the collimating element. The collimating element can eliminate astigmatism between the fast and slow axes, improve the light beam quality, compress the divergence angle of the light beam in the fast axis direction, and improve the radiation utilization rate of the laser diode die. The collimating element may be any element known to those skill in the art that can collimate light, such as a cylindrical lens, a D lens, an optical fiber rod, an aspheric lens, and the like.

Figure 4G:
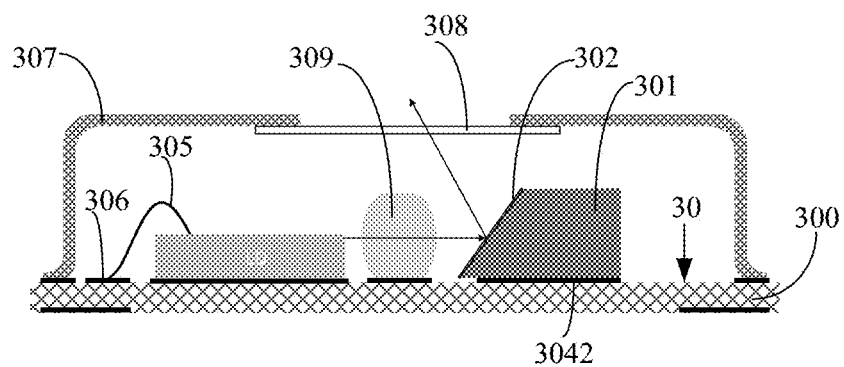
FIG. 4G is a cross-sectional view of the laser diode package structure according to still another embodiment of the present disclosure.

As shown in FIG. 4G, taking the cylindrical lens 309 as the collimating element as an example, the cylindrical lens 309 is disposed between the laser diode die and the reflective surface in order to make all the emitted light reflected from the exit surface of each laser diode die 303 reach the cylindrical lens 309. The curved surface of the cylindrical lens is opposite to the exit surface of the laser diode die 303, such that the emitted light of the laser diode die 303 can irradiate the curved surface of the cylindrical lens 309. In some embodiments, the size of the curved surface of the cylindrical lens 309 may be larger than the size of the spot of the light emitted from the laser diode die 303 on the plane where the light incident surface of the cylindrical lens 309 is located, thereby ensuring that all the emitted light can irradiate the cylindrical lens 309 and be collimated.

In one example, the collimating element may be mounted on the first surface of the substrate. For example, as shown in FIG. 4G, the cylindrical lens 309 is mounted on the first surface 30 of the substrate 300.

In one example, the surface of the collimating element mounted on the substrate 300 may be flat, and the plane arrangement can better combine the collimating element with the first surface of the substrate, such that the collimating element can be easily mounted on the substrate. In one example, the top surface of the collimating element may be flat. In the process of mounting the collimating element on the substrate, it generally involves the use of a transfer tool to pick up the collimating element, and then place the collimating element in a predetermined position. The top surface of the collimating element being flat can make the collimating element suitable for suction.

The collimating element may be mounted on the substrate in any suitable manner. For example, the collimating element (e.g., the cylindrical lens 309) may be mounted on the first surface of the substrate 300 through an adhesive layer.

Further, the laser diode package module structure may further include a cover, which may be disposed on the first surface 30 of the substrate 300, and a accommodation space may be formed between the substrate 300 and the cover. A light-transmitting area may be at least partially disposed on the surface of the cover opposite to the substrate 300.

In the embodiments of the present disclosure, the cover is not limited to a certain structure. The cover may be at least partially disposed with a light-transmitting area, and the emitted light of the laser diode die may be reflected by the reflective surface and emitted through the light-transmitting area. For example, in this embodiment, the cover is a metal shell with a glass widow.

Further, as shown in FIGS. 4A, 4C, 4E, and 4G, the cover includes a U-shapes or a square cover 307 with a window, and a light-transmitting plate 308 that covers the window to from the light-transmitting area. The emitted light of the laser diode die 303 is reflected and emitted from the light-transmitting plate. The light-transmitting plate may be parallel to the first surface of the substrate, or the cover may be an all light-transmitting plate-like structure. Further, the cover can provide protection and an airtight environment for the die enclosed therein.

As an example, the projection of the U-shaped cover 307 with the window on the first surface of the substrate may be circular or other suitable shapes. The projection of the square cover 307 on the first surface of the substrate is a square. The size of the square cover may match the size of the substrate, which can effectively reduce the package size.

The material of the cover may be any suitable material. For example, the material of the cover may include metal, resin, or ceramic. In one example, the material of the cover 307 may use metal materials. The metal materials may be a material similar to the thermal expansion coefficient of the light-transmitting plate 308, such as a Kovar alloy. Since the thermal expansion coefficient of the cover 307 and the light-transmitting plate 308 is similar, therefore, when the light-transmitting plate is bonded to the window of the cover 307, the cracking of the light-transmitting plate due to the difference thermal expansion coefficient can be avoided. In some embodiments, the cover may be fixedly connected to the first surface of the substrate by welding. The welding may use any suitable welding method, such as parallel seam welding or store energy welding. In one example, the light-transmitting plate 308 may also be bonded to the inner side of the window of the cover.

The light-transmitting plate 308 may be made of commonly used light-transmitting materials, such as glass, which needs to have high passability to the laser wavelength emitted by the laser diode die.

In another example, the cover may be an all light-transmitting plate-like structure. The plate-shaped structure may use commonly used light-transmitting material, such as glass. The glass needs to have high passability to the laser wavelength emitted by the laser diode die. The overall structure of the substrate may be in the shape of a groove, and the groove may be a square groove or a circular groove. The cover may be disposed on top of the groove of the substrate and joined with the top surface of the substrate to cover the groove, and the accommodation space may be formed between the substrate and the cover.

In the aforementioned package module solution shown in FIGS. 4A to 4G, due to the short pin path, the parasitic inductance is greatly reduced compared with the TO package, and the packaging can be performed through the operation of substrate packaging, which has high packaging efficient and the packaged die is suitable for SMT.

Figure 4H:
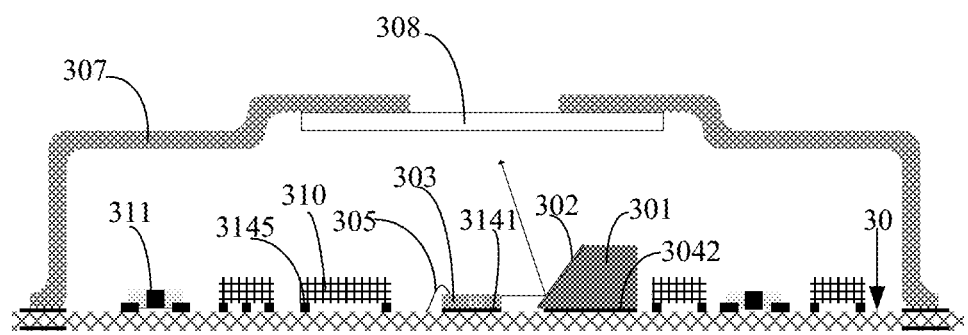
FIG. 4H is a cross-sectional view of the laser diode package structure according to another embodiment of the present disclosure.
Figure 4I:
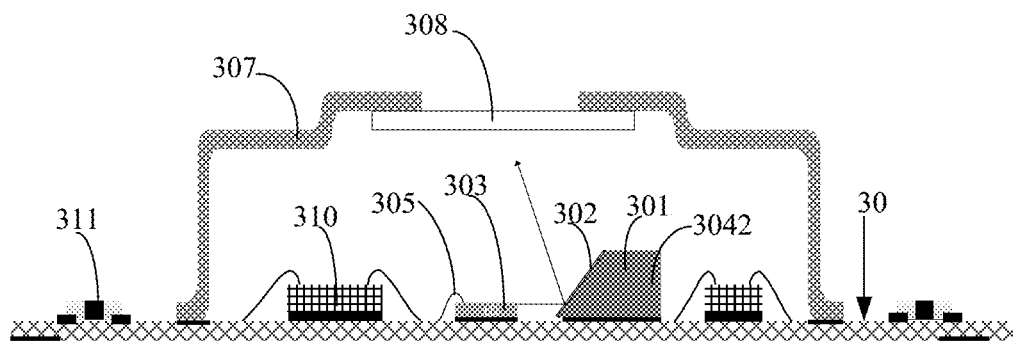
FIG. 4I is a cross-sectional view of the laser diode package structure according to another embodiment of the present disclosure.

In one example, as shown in FIGS. 4H and 4I, in order to improve the integration of the package, shorten the pin between the laser diode die 303 and the driving chip, and further reduce the inductance, the package module may further include a driving chip 310 for controlling the emission of the laser diode die 303. The driving chip 310 may be disposed in the accommodation space, and the driving chip 310 may be mounted on the first surface 30 of the substrate 300. In this embodiment, the driving chip 310 that controls the emission of the laser diode die and the laser diode die may be directly packaged together, and both may be packaged in the accommodation space formed between the substrate and the cover. By using this setting, the inductance between the laser diode die and the driving chip next to the laser diode die in the conventional TO package and the distributed inductance on the line can be eliminated to reduce the distributed inductance of the package module, thereby realizing high-power laser emission and narrow pulse laser driving.

In some embodiments, in the package module, the laser diode die may be placed as close to the driving chip as possible. The shorter the distance between the laser diode die and the driving chip, the more effective the distributed inductance can be reduced. The loss of the distributed inductance of the transmitting module will be much smaller by using this setting, and it is easier to achieve high-power laser emission. The reduction of the distributed inductance also makes narrow pulse laser driving possible.

In a specific embodiment of the present disclosure, the package module may further include a switching chip. The switching chip may also be disposed in the accommodation space. The switching chip may include a switching circuit, and the switching circuit may be used for controlling the laser diode die to emit laser light under the driving of the driving circuit.

In addition, as shown in FIGS. 4H and 4I, other devices may also be disposed on the substrate, for example, FET devices or other types of switching devices, or the driving chip of the switching device, needed resistors and capacitors 311, and surface mount circuit (SMT IC) and other devices. These devices may be mounted on the substrate through a conductive material, such as a conductive adhesive (including but not limited to solder paste) through SMT.

In the package module structure shown in FIG. 4H, the laser diode die 303, the driving chip 310, the reflective surface, and other devices are all mounted on the first surface of the substrate 300, and are all disposed in the accommodation space between the cover and the substrate. In some embodiments, in the package module structure, a non-volatile or low-volatile conductive adhesive layer may be used to mount on the first surface of the substrate. Such arrangement can prevent the volatilization of volatile substances in the volatile conductive adhesive layer from polluting the laser diode die, the reflective surface, and the light-transmitting area, such that the light-emitting efficiency of the laser diode die will not be affected.

In another example, in the package module structure shown in FIG. 4I, the driving chip 310, the reflective surface, and the laser diode die 303 are packaged in the accommodation space, and the package module further includes solder paste mounted devices. The solder paste mounted devices are disposed outside the accommodation space, that is, on the substrate outside the cover. The solder paste mounted devices may include, but is not limited to, FET devices or other types of switching devices, or the driving chip for the switching device, needed resistors and capacitors 311, etc. In this embodiment, taking the resistors and capacitors 311 as an example, the resistors and capacitors 311 may be mounted by solder paste on the first surface of the substrate outside the accommodation space, that is, on the first surface of the substrate outside the cover. The advantage of this arrangement is that the integrated driving chip 310 and the laser diode die 303 are integrated in the accommodation space, such that there is a shorter distance between the two, and the purpose of reducing parasitic inductance can be achieved. At the same time, the solder paste mounted devices are isolated from the laser diode die 303 to prevent the flux in the solder paste from volatilizing, contaminating the laser diode die and the reflector, and then affecting the light output efficiency of the laser diode die.

In summary, in the package module structure of the above embodiment, a reflective surface may be disposed on the propagation path of the emitted light of the laser diode die to reflect the emitted light originally parallel to the first surface of the substrate. The reflected light may be emitted from a light-transmitting area on the cover. The laser diode die may emit light from the side, and the direction of the emitted light may be substantially parallel to the first surface of the substrate. By placing the reflective surface on the propagation path of the emitted light of the laser diode die, the emitted light may be reflected and emitted from the light-transmitting area on the cover, thereby changing the propagation direction of the light. Since a reflective surface is added to the propagation path of the emitted light, the bottom surface of the laser diode die may be mounted in the accommodation space, and the emitted light may be emitted in a direction substantially perpendicular to the first surface. In addition, the area of the bottom surface of the laser diode die is relatively large, which can facilitate the placement of the die and the positioning of the package module in the whole device. Further, the reflective surface of the present disclosure is specifically an inclined surface prepared by etching the semiconductor using anisotropy. Since each semiconductor has a specific crystal orientation, the angle of the inclined surface formed by it is also specific, such that the light reflected by the reflective surface may be emitted in a specific direction. In addition, the pin path in the package module of the present disclosure is short, and the parasitic inductance can be greatly reduced compared with the TO package. As such, the package module can be packaged by substrate packaging with high packaging efficiency, and the packaged die is suitable for SMT.

Second Embodiment

Another embodiment of the package module structure of the present disclosure will be described below with reference to FIGS. 5A to 5B and FIGS. 6A to 6C. In order to avoid repetition, in this embodiment, for the structure and material of the substrate 400, the laser diode die 403, the cover 407, the light-transmitting plate 408, etc., the description of some features that are the same as those in the foregoing first embodiment, reference may be made to the foregoing first embodiment, which will not be repeated here. The difference between this embodiment and the foregoing first embodiment lies in the structure of the anisotropic semiconductor included in the package module.

Figure 6A:
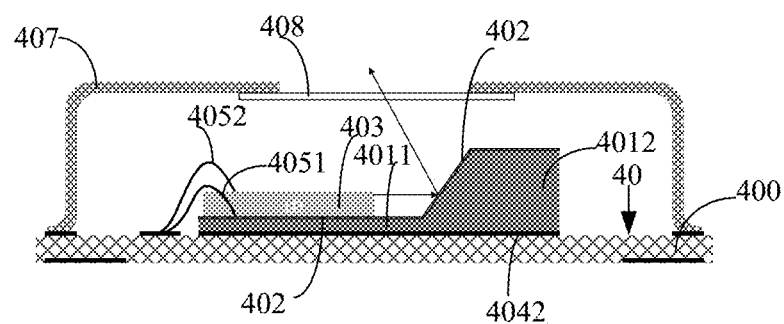
FIG. 6A is a cross-sectional view of the laser diode package structure according to another embodiment of the present disclosure.
Figure 6B:
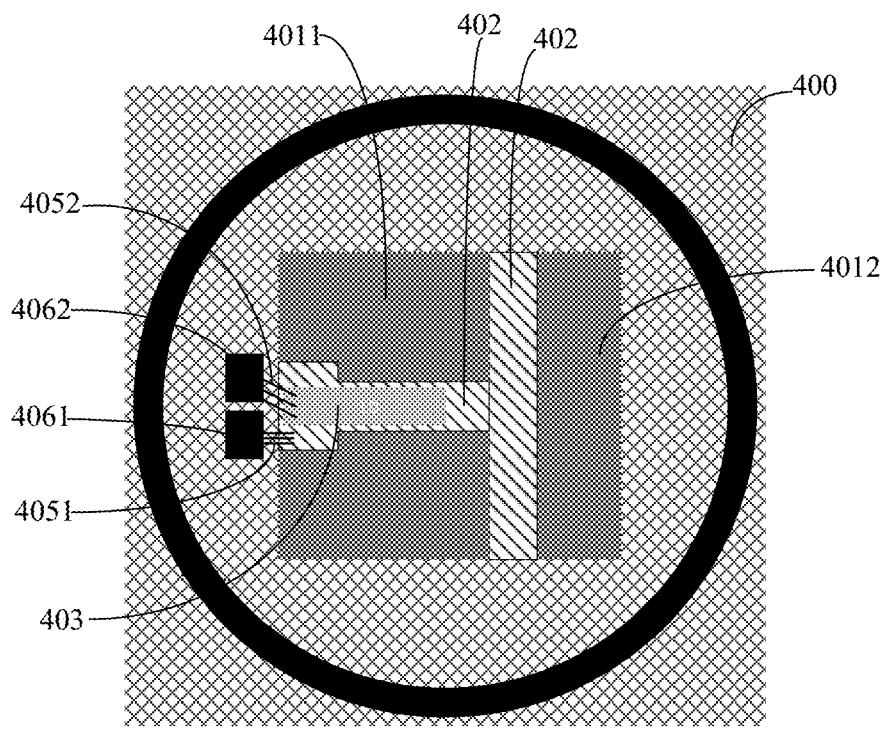
FIG. 6B is a top view of the laser diode package module structure in FIG. 6A after the cover is removed.

More specifically, as an example, as shown in FIGS. 6A and 6B, the package module includes an anisotropic semiconductor. The semiconductor is disposed in the accommodation space formed by the cover and the substrate. The semiconductor includes a first part 4011 positioned at the bottom and a second part positioned on a partial surface of the first part 4011, where the reflective surface is disposed on at least one inclined surface of the second part 4012.

As an example, the reflective surface may specifically be an inclined surface prepared by etching the semiconductor using anisotropy, such as etching the semiconductor using wet etching. As such, the etching may be stopped in the semiconductor without etching through the upper and lower surfaces of the semiconductor substrate, thereby forming a semiconductor including the first part 4011 and the second part 4012. Due to the anisotropy of the semiconductor, the second part 4012 may have at least one inclined surface. For example, when the semiconductor is silicon, the acute angle between the inclined surface and the second part below may be generally 54.74°.

Figure 5A:
FIG. 5A is a cross-sectional view of an SOI wafer according to an embodiment of the present disclosure.
Figure 5B:
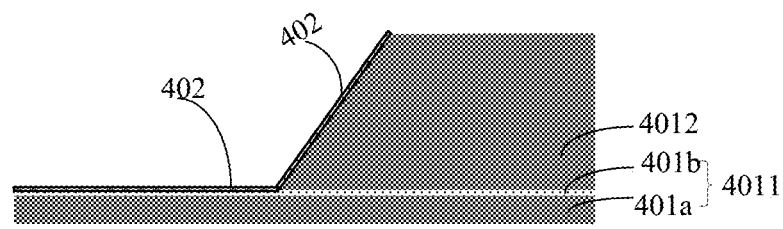
FIG. 5B is a cross-sectional view of a reflective surface disposed on an inclined surface of the SOI wafer according to an embodiment of the present disclosure.

In one example, as shown in FIGS. 5A and 5B, taking semiconductor as a SOI wafer 401 as an example, the SOI wafer 401 includes a buried oxide and tow upper and lower silicon layers separated by the buried oxide. The second part 4012 may be formed by etching one of the two silicon layers. The etching may be a wet etching, for example, wet etching may be used. The wet etching may use an etchant with high selectivity to silicon relative to the buried oxide, such as KOH solution. For example, before etching, it is also possible to form a mask layer, such as a photoresist, on a partial area of the surface of the SOI wafer 401 to be etched, and define a pattern of the surface of the second part 4012 to be formed in the mask layer through a photolithography process, that is, the surface of the second part 4012 to be formed may be covered with a patterned mask layer, and other areas other than the surface of the second part 4012 may be exposed. Subsequently, the SOI wafer 401 with the mask layer formed on the part of the surface area may be etched and stopped in the buried oxide 401b. Due to the anisotropy of the semiconductor, the formed second part 4012 has at least one inclined surface, and the reflective surface may be at least one inclined surface of the second part 4012. The buried oxide 401b and the silicon layer 410a under the buried oxide 401b may serve as the first part 4011, and the anisotropically etched silicon layer on the buried oxide 401b may serve as the second part 4012.

In another example, as shown in FIG. 5B, the reflective surface includes a reflective film 402 coated on an inclined surface prepared by etching the semiconductor using anisotropy to increase the reflectivity of the reflective surface, thereby increasing the output power of the laser. In some embodiments, at least a part of the exposed surface of the first part 4011 may also be covered with a conductive layer.

For example, the reflective film 402 may be a conductive film. The reflective film 402 on the reflective surface may further extend to cover at least a part of the exposed surface of the first part 4011 outside the reflective surface. When the semiconductor is an SOI wafer, the reflective film 402 may extend to the surface of the buried oxide 401*b* outside the second part 4012. For example, the conductive reflective film 402 may be a metal layer. The material of the reflective film 402 may include any suitable material that reflects light. For example, the reflective film 402 may include at least one of gold, silver, and aluminum. The reflective film 402 may be formed on the inclined surface of the semiconductor using a deposition method, such as vacuum evaporation.

Figure 6C:
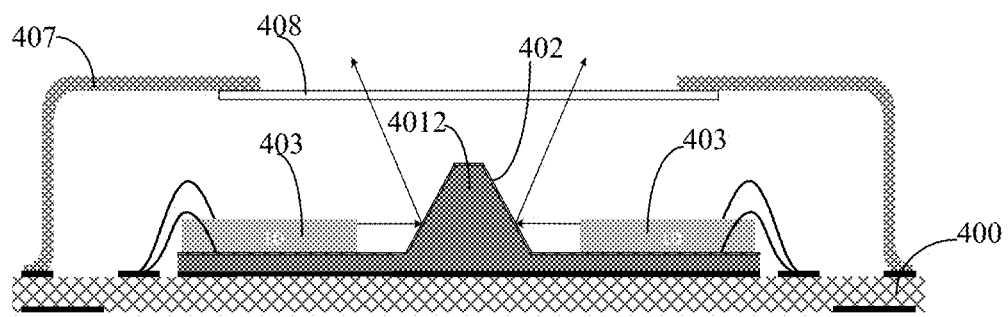
FIG. 6C is a cross-sectional view of the laser diode package structure according to another embodiment of the present disclosure.

In one example, the laser diode die 403 may be mounted on the surface of the first part 4011 outside the reflective surface, and the exit surface of the laser diode die 403 may be disposed opposite to the reflective surface, such that the exit light of the laser diode die may be reflected by the reflective surface and emitted through the light-transmitting area. In this embodiment, the characteristics of the positional relationship between the laser diode die and the reflective surface in the first embodiment are also applicable. For example, as shown in FIGS. 6A to 6C, a laser diode die is disposed on the surface of the first part 4011 outside each reflective surface, and the exit surface of the laser diode die is opposite to the reflective surface. Alternatively, at least two laser diode dies are disposed on the surface of the first part outside each reflective surface, and the exit surface of each laser diode die is opposite to the reflective surface.

In one example, as shown in FIG. 6B, the laser diode die 403 is disposed on a conductive reflective film 402 positioned on the surface of the first part. The pattern of the conductive reflective film 402 on the surface of the first part may match and may be electrically connected to the bottom surface of the laser diode die, and the area of the reflective film 402 positioned on the surface of the first part may be larger than the area of the bottom surface of the laser diode die. As such, the conductive reflective film 402 partially positioned on the surface of the first part may be exposed from the outside of the laser diode die, such that it is convenient to lead out the electrodes on the bottom surface of the laser diode die. For example, the shape of the reflective film 402 on the surface of the first part 4011 in FIG. 6B is T-shaped, or it can be other suitable shapes, such as a strip, a cross, etc. It should be noted that although FIG. 6B shows the case where the laser diode die is disposed on the surface of the first part 4011, for at least two laser diode dies disposed side by side on the surface of the first part 4011, a plurality of reflective films space apart from each other may be correspondingly disposed on the surface of the first part, and each reflective film may correspond to a laser diode die.

Any suitable method may be used to form the reflective film 402 on the surface of the first part 4011. In one example, the method of forming the reflective film 402 may include the following steps. Step A1, providing a semiconductor, the semiconductor (e.g., a silicon wafer or an SOI wafer) may include a first part 4011 positioned at the bottom and a second part 4012 positioned on a partial surface of the first part 4011, where the reflective surface may be disposed on at least one inclined surface of the second part 4012. Next, perform step A2, which includes forming the reflective film 402 that can completely cover the exposed surfaces of the first part 4011 and the second part 4012, where the reflective film 402 may be formed by a method such as vacuum evaporation.

Subsequently, perform step A3, which includes patterning the reflective film 402 using photolithography and etching processes. For example, a photoresist layer may be coated on the reflective film, and the photoresist layer may be patterned by the processes of exposure and development of the photolithography process to form a patterned photoresist layer. The patterned photoresist layer may define parameters such as the pattern shape and position of the reflective film that is scheduled to be formed on the first part 4011, and the patterned photoresist layer may be cover the inclined surface of the second part intended to be used as a reflective surface. Then the patterned photoresist layer may be used as a mask to etch the reflective film on the first part 4011 and stop in the first part 4011 to form a patterned reflective film 402 on the surface of the first part 4011, and finally remove the photoresist layer.

Further, in the technical solution of the packaging structure of this embodiment, when the laser diode die is mounted on the surface of the first part 4011, the pattern of the reflective film 402 on the first part 4011 may also be used as an alignment mark. Since the pattern of the alignment mark is formed by photolithography and etching, its accuracy can be within 2 μm. An alignment mark with high accuracy can improve the position accuracy of the laser diode die during the mounting, and the relative position accuracy between the laser diode die and the reflective surface.

In this embodiment, the laser diode die 403 may be mounted on the surface of the first part by, for example, the method provided in the aforementioned first embodiment. For example, the laser diode die 403 may be mounted on the reflective film 402 on the first part through a conductive adhesive layer to realize the electrical connection between the laser diode die 403 and the reflective film 402.

In one example, as shown in FIGS. 6A and 6B, an anisotropic semiconductor (such as a silicon wafer or an SOI wafer) is mounted on the first surface 40 of the substrate 400 through a conductive adhesive layer, that is, the bottom surface of the first part 4011 is attached to the substrate 400 and disposed in the accommodation space.

In one example, as shown in FIGS. 6A and 6B, the laser diode die 403 includes a first electrode and a second electrode disposed oppositely. For example, the first electrode may be disposed on the bottom surface of the laser diode die 403, and the second electrode may be disposed on the top surface of the laser diode die 403. The first electrode may be a p-electrode, and the second electrode may be an n-electrode. Alternatively, the first electrode may be an n-electrode, and the second electrode may be a p-electrode. The first electrode and the second electrode may be respectively electrically connected to the substrate 400 through wires, in particular to different pads on the first surface of the substrate. For example, the electrode on the top surface of the laser diode die 403 may be electrically connected to a pad 4062 through a wire 4052, and the electrode on the bottom surface of the laser diode die 403 may be electrically connected to a pad 4061 through a wire 4051. Since the electrode on the bottoms surface is electrically connected to the reflective film 402 positioned on the first part 4011, the reflective film 402 may be electrically connected to the pad 4062 through a wire, thereby achieving electrical connection between the bottom surface of the laser diode die 403 and the pad 4062. The pad 4062 and the pad 4061 may be spaced apart from each other. In order to ensure that the reflective film can lead out the electrodes on the bottom surface of the laser diode die 403, the area of the reflective film 402 on the first part 4011 may be larger than that of the bottom surface of the laser diode die 403. That is, the laser diode die 403 can cover a part of the reflective film 402 on the surface of the first part 4011.

It should be noted that the above method of leading out the first electrode and the second electrode is merely an example, and other suitable methods can also be applied to the present disclosure. For example, it can also be achieved by providing a contact hole under each laser diode die that penetrates the first part and is electrically connected to the bottom electrode of the laser diode die. The bottom electrode (e.g., the first electrode) of the laser diode die may be electrically connected through the contact hole. A substrate metal layer may be disposed under the bottom surface of the first part of the semiconductor on the substrate. The metal layer of the substrate can be electrically connected to the bottom electrode (e.g., the first electrode) of the laser diode die through the contact hole, thereby realizing the lead out of the bottom electrode of the laser diode die.

In one example, FIC. 6C shows the structure of a package module. The structure of the package module is difference from the structure shown in FIG. 6A. In FIG. 6C, the second part 4012 has two symmetrically inclined surfaces disposed opposite to each other. The inclined surfaces may be reflective surfaces, and each of the reflective surfaces may be disposed opposite to the exit surface of at least one laser diode die 403. Each laser diode die 403 may be mounted on the reflective film 402 positioned on the first part through the conductive adhesive layer, thereby realizing the electrical connection between the laser diode die 403 and the reflective film 402. As such, FIG. 6C shows a 2×N type package structure.

It should be noted that in this embodiment, the anisotropic semiconductor can also be replaced with other suitable materials, such as glass, ceramic, or resin.

In summary, the package structure in this embodiment also has the advantage of the package structure in the first embodiment. The reflective film on the reflective surface may be used to reflect the emitted light of the laser diode die, and the part of the reflective film positioned on the first part outside the reflective surface may also be used to electrically connect the bottom surface of the laser diode die, and may be used as an external mark when the laser diode die is being mounted. The reflective film on the first part formed by photolithography and etching has high accuracy, such that the position accuracy of the laser diode die mounting and the relative position accuracy between the laser diode die and the reflective film can be improved.

Third Embodiment

Another embodiment of the package module structure of the present disclosure will be described below with reference to FIGS. 7A to 7C, FIGS. 8A to 8C, and FIGS. 9A to 9D. In order to avoid repetition, in this embodiment, for the structure and material of the substrate 400, the reflective film 502, the laser diode die 503, the cover 507, the light-transmitting plate 508, the substrate metal layer 5041, 5042, etc., the description of some features that are the same as those in the foregoing first and second embodiments, reference may be made to the foregoing first and second embodiments, which will not be repeated here. The difference between this embodiment and the foregoing first embodiment is that the anisotropic semiconductor in the first embodiment is replaced with a glass in this embodiment.

Figure 7A:
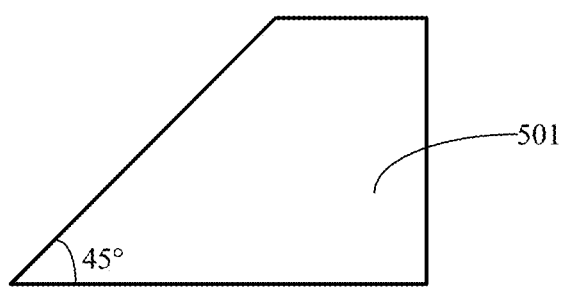
FIG. 7A is a cross-sectional view of a glass with an inclined surface according to another embodiment of the present disclosure.
Figure 7B:
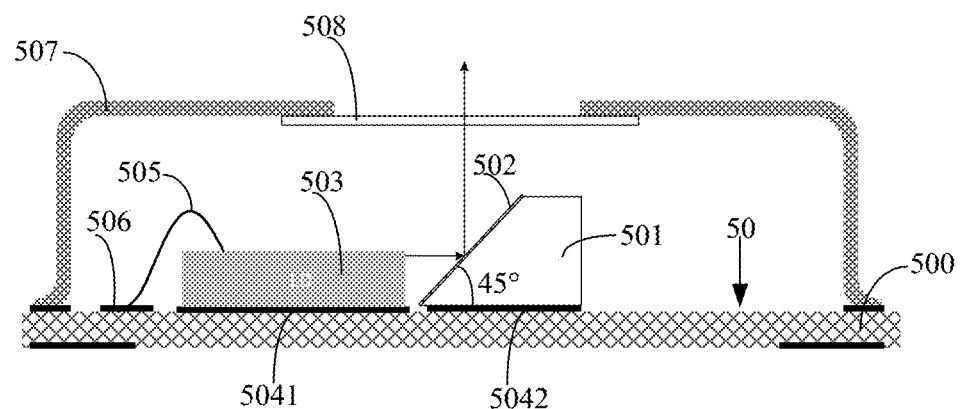
FIG. 7B is a cross-sectional view of the laser diode package structure according to an embodiment of the present disclosure.
Figure 7C:
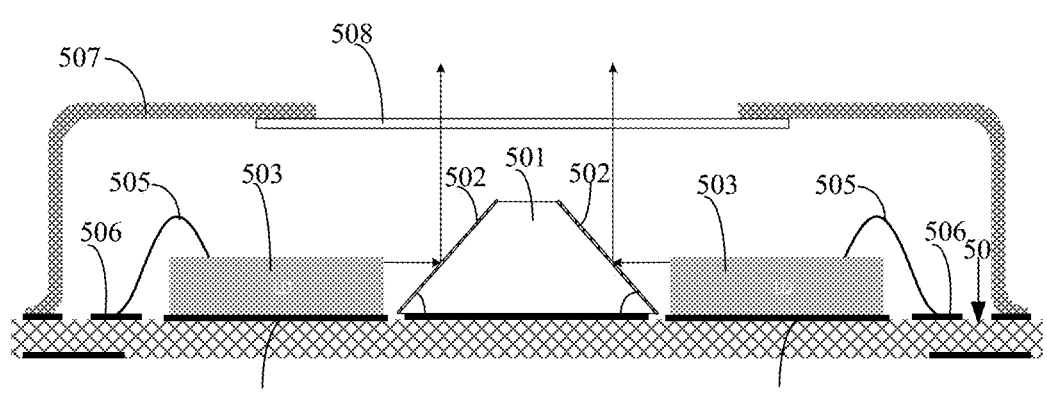
FIG. 7C is a cross-sectional view of the laser diode package structure according to another embodiment of the present disclosure.

More specifically, in an example, as shown in FIGS. 7A to 7C, the package module includes a glass 501. The glass 501 may include at least one inclined surface, and the reflective surface may include a reflective film 502 coated on the inclined surface of the glass 501.

The angle between the reflective surface and the bottom surface of the glass can be any suitable angle less than 90°. In some embodiments, the angle between the reflective surface and the bottom surface of the glass may be substantially 45°. With this arrangement, the emitted light emitted from the emitting surface of the laser diode die 503 can be emitted from the light-transmitting area on the cover in a direction perpendicular to the first surface of the substrate after being reflected by the reflective surface.

The glass 501 with at least inclined surface may be formed by any suitable method. For example, the conventional optical element manufacturing method can be used to process the optical glass into a glass prism of a predetermined size by grinding, polishing, and coating the optical glass, such that the angle between the reflective surface and the bottom surface of the glass may be 45° or any other angle. Alternatively, the glass 501 of a predetermined size can also be formed by molding. The molding method includes pouring the molten optical glass blank into a low-temperature mold that is 50° C. higher than the glass transition point and pressing it.

In one example, FIG. 7B shows a glass 501 with only one inclined surface. A reflective film 502 is disposed on the inclined surface as a reflective surface. At least one laser diode die 503 is disposed on the first surface of the substrate outside the reflective surface, and the exit surface of each laser diode die is disposed opposite to the reflective surface. Further, the light emitted from the exit surface of the laser diode die is perpendicular to the bottom side of the reflective surface, and the angle between the reflective surface and the bottom surface of the glass is substantially 45°. As such, the emitted light emitted from the emitting surface of the laser diode die 503 may be reflected by the reflective surface and then emitted from the light-transmitting area on the cover in a direction perpendicular to the first surface of the substrate.

In another example, FIG. 7C shows a glass 501 with two inclined surfaces disposed opposite to each other. A reflective film 502 is disposed on the tow inclined surfaces as the reflective surface, where at least one laser diode die 503 is disposed on the first surface of the substrate 500 outside each reflective surface. The inclined surfaces of the glass opposite to each other can be symmetrical or asymmetrical, that is the angle between one of the inclined surfaces and the bottom surface of the glass may be different from the angle between the other inclined surface and the bottom surface of the glass.

Further, the reflective surface may also be a concave surface. The concave surface may specifically be a concave surface of an anisotropic semiconductor, or a concave surface of glass or other suitable concave surface that can be used as a mirror material. The concave reflective surface can not only reflect the light emitted by the laser diode die, but also can play a similar role to the aforementioned collimating element, which can reduce the astigmatism between the fast and slow axes, improve the light beam quality, reduce the divergence angle in the fast axis direction, and improve the radiation utilization rate under the condition of limited light exit aperture.

Figure 8A:
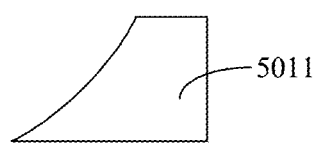
FIG. 8A is a cross-sectional view of the glass with a concave surface according to another embodiment of the present disclosure.
Figure 8B:
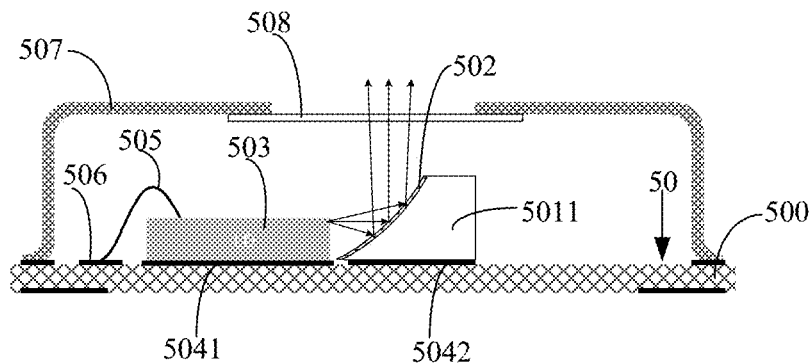
FIG. 8B is a cross-sectional view of the laser diode package structure according to an embodiment of the present disclosure.
Figure 8C:
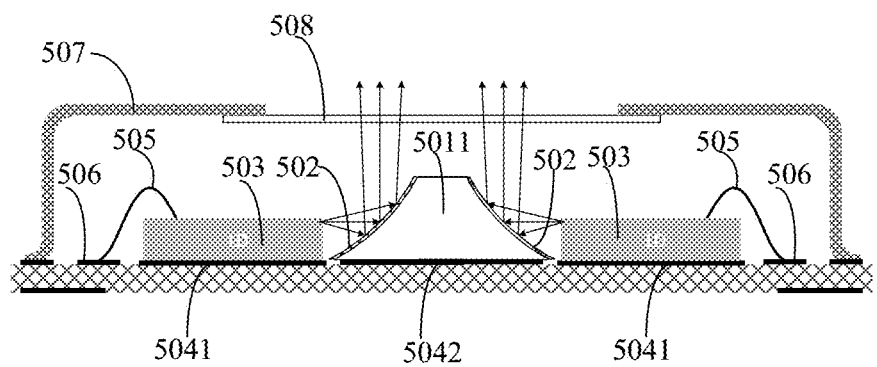
FIG. 8C is a cross-sectional view of the laser diode package structure according to another embodiment of the present disclosure.

In one example, as shown in FIGS. 8A to 8C, taking the reflective surface as a concave surface of glass 5011 as an example, the reflective surface further includes a reflective film 502 coated on at least one concave surface of the glass

5011. FIG. 8B shows that the reflective surface being specifically a concave surface of the glass. FIG. 8C shows that the reflective surface including specifically two opposite concave surfaces of the glass, and the two opposite concave surfaces can also be disposed symmetrically.

The concave glass 5011 may be formed by any suitable method, for example, the reflective surface of the glass may be made into a concave shape by a molding method, and a reflective film 502 may be coated on the concave surface.

In some embodiments, when the reflective surface is a concave surface of an anisotropic semiconductor, the concave surface may be formed by any suitable method known to those skilled in the art. For example, the concave surface described above may be obtained by isotropic wet etching of the semiconductor.

It should be noted that the glass described above may be mounted on the first surface of the substrate through a conductive adhesive layer. For detailed description, reference may be made to the first embodiment described above, which will not be repeated here.

For example, as shown in FIGS. 7B to 7C and FIGS. 8C to 8C, the laser diode die 503 can be mounted on the first surface 50 of the substrate 500 through a conductive adhesive layer. The second electrode (that is, the electrode on the top surface) of the laser diode die 503 is electrically connected to a pad 506 on the first surface 50 of the substrate 500 through a wire 505.

It should be noted that for the arrangement of the laser diode die 503 on the outside of the concave reflective surface, reference may be made to the first and second embodiments described above, which will not be repeated here.

Figure 9A:
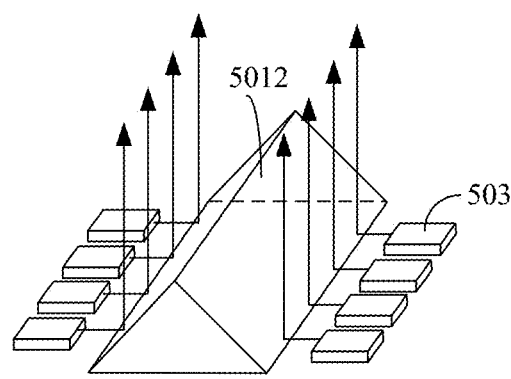
FIG. 9A is a partial three-dimensional (3D) schematic diagram of the laser diode package module structure according to an embodiment of the present disclosure.
Figure 9B:
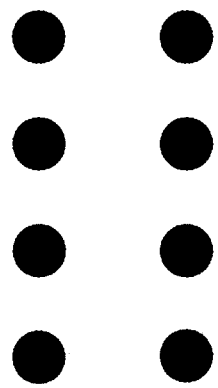
FIG. 9B shows an equivalent position of a laser diode die in FIG. 9A.

In one example, as shown in FIG. 9A, tow obliquely disposed reflective surfaces are respectively disposed on two inclined surfaces opposite to each other on a glass 5012, where each reflective surface is disposed opposite to the exit surface of at least one laser diode die 503. As such, the exit light of each laser diode die 503 may be reflected by the reflective surface and then emitted through the light-transmitting area. The glass 5012 is in the shape of a triangular prism, one side surface of the triangular prism-shaped glass is mounted on the first surface of the substrate, the other two sides surfaces are inclined surfaces as the reflective surfaces, and the reflective surfaces include reflective films coated on the inclined surfaces (not shown in FIG. 9A). Further, the angle between the two inclined surface as the reflective surfaces and the bottom surface of the triangular prism mounted on the substrate can be 45° or other suitable angles. FIG. 9A show four laser diode dies 503 disposed side by side on the outside of each reflective surface, and different numbers of laser diode dies 503 can also be disposed outside of different reflective surfaces. The number can be reasonably selected based on the needs of the device structure. For example, three laser diode dies may be disposed on the outside of on reflective surface, and four laser diode dies may be disposed on the outside of the other side. When four laser diode dies are mounted on the outside of each reflective surface, FIG. 9B shows the equivalent position of the laser diode die 503 in FIG. 9A, in which the block dots shown in the FIG. 9B only represent the positional relationship and are not related to the shape of the light source. The two row of laser diode dies 503 shown in FIG. 9B are disposed opposite to each other, and the laser diode dies 503 in each row are arranged at equal intervals.

Figure 9C:
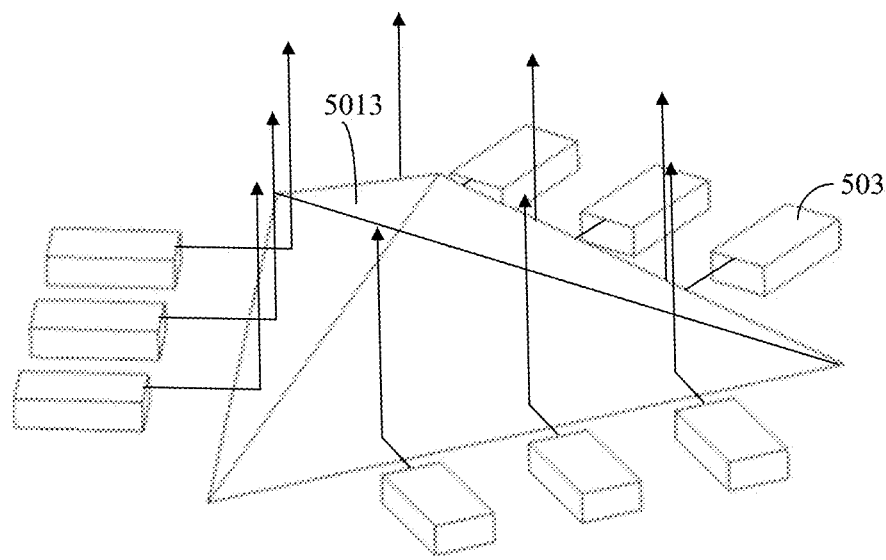
FIG. 9C is a partial 3D schematic diagram of the laser diode package module structure according to another embodiment of the present disclosure.
Figure 9D:
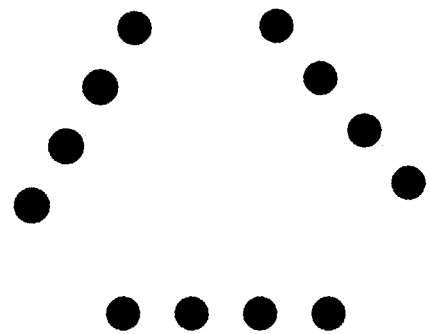
FIG. 9D shows an equivalent position of the laser diode die in FIG. 9C.

In one example, the glass may also be in the shape of a triangular pyramid or a triangular prism. For example, the glass 5013 shown in FIG. 9C is in the shape of a triangular pyramid, and three obliquely disposed reflective surfaces are respectively disposed on the three inclined surfaces of the glass. Each of the reflective surfaces is disposed opposite to the exit surface of at least one of the laser diode dies 503, such that the exit light of each laser diode die 503 may be reflected by the reflective surface and then emitted through the light-transmitting area. For example, as shown in FIGS. 9C and 9D, three laser diode dies 503 are disposed on the outside of each reflective surface, and the three laser diode dies 503 on each side are disposed at equal intervals. FIG. 9D shows the equivalent position of the laser diode die 503 in FIG. 9C, in which the block dots shown in the FIG. 9D only represent the positional relationship and are not related to the shape of the light source.

It should be noted that the glass described above is not limited double-sided reflection, but also multi-sided reflection, and its shape can be N prism or N pyramid, where N is greater than or equal to three. In addition, not only the glass has a plurality of obliquely disposed reflective surfaces, but also the anisotropic semiconductor or other materials in the foregoing first and second embodiments may also have a plurality of obliquely disposed reflective surfaces to form, for example, a structure such as a triangular prism, an N prism, or an N pyramid.

The package module in this embodiment also has the advantages of the package module in the first embodiment. In addition, for the example where the reflective surface is a concave surface, in addition to reflecting the light emitted by the laser diode die, it can also reduce the astigmatism between the fast and slow axes and improve the light beam quality. At the same, it is possible to avoid the additional optical collimating elements such as cylindrical lenses on the substrate, which can reduce the size of the package module structure.

It should be noted that the package structures in the first, second, and third embodiments described above are only examples, and the package structure of the present disclosure is not limited to the above examples. Various modifications of the above examples can also be applied to the present disclosure, for example, the semiconductor and glass with inclined surfaces may be mounted in a package module; the number of laser diode dies opposite toe each reflective surface, the number and size of the semiconductors or glasses included in the package module, etc. can be selected reasonably based on actual needs, which will not be listed here.

Fourth Embodiment

Figure 10:
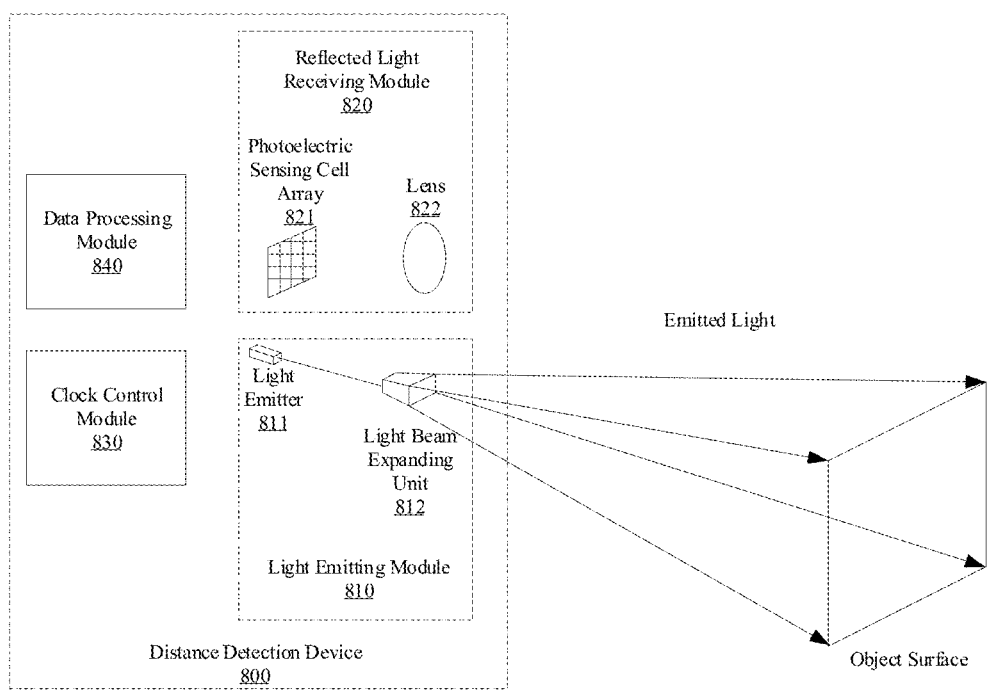
FIG. 10 is a schematic diagram of a distance detection device according to an embodiment of the present disclosure.

As shown in FIG. 10, an embodiment of the present disclosure provides a distance detection device 800 including a light emitting module 810 and a reflected light receiving module 820. The light emitting module 810 may include at least one laser diode package module described in the first, second, or third embodiment for emitting optical signals, and the optical signals emitted by the optical emitting module 801 may cover the field of view (FOV) of the distance detection device 800. The reflected light receiving module 820 can be used for receiving the reflected light after the light emitted by the light emitting module 810 encounters an object to be measured, and calculating the distance between the distance detection device 800 and the object to be measured. The light emitting module 810 and its working principle will be described below with reference to FIG. 10.

As shown in FIG. 10, the light emitting module 810 includes a light emitter 811 and a light beam expanding unit 812. The light emitter 811 can be used to emit light, and the light beam expanding unit 812 can be used to perform at least one of the processes of collimation, beam expansion, homogenization, and FOV expansion on the light emitted by the light emitter 811. The light emitted by the light emitter 811 may pass through at least one of the processes of collimation, beam expansion, homogenization, and FOV expansion of the light beam expanding unit 812, such that the emitted light becomes divergent and evenly distributed, which can cover a certain two-dimensional angle in the scene. As shown in FIG. 8, the emitted light can cover at least a part of the surface of the object to be measure.

In one example, the light emitter 811 may be a laser diode. For the wavelength of the light emitted by the light emitter 811, in one example, light with a wavelength between 895 nanometers and 915 nanometers may be selected, for example, light with a wavelength of 905 nanometers may be selected. In another example, light with a wavelength between 1540 nanometers and 1560 nanometers may be selected. In other examples, other suitable wavelengths of light may also be selected based on the application scenarios and various needs.

In one example, the light beam expanding unit 812 may be realized by a single-stage or multi-stage beam expansion system. The light beam expansion process can be reflective or transmission, or a combination of the two. In one example, a holographic filter may be used to obtain a large-angle beam composed of multiple sub-beams.

In another example, a laser diode array may also be used to form multiple beams of light with laser diodes to obtain lasers similar to the beam expansion (such as VESEL array lasers).

In another example, a two-dimensional angle adjustable micro-electromechanical system (MEMS) lens may also be used to reflect the emitted light. By driving the MEMS micro-mirrors to constantly change the angle between the mirror surface and the light beam, the angle of the reflected light may be constantly changing, thereby diverging into a two-dimensional angle to cover the entire surface of the object to be measured.

The distance detection device may be used to sense external environmental information, such as distance information, angle information, reflection intensity information, speed information, etc. of a target in the environment. More specifically, the distance detection device in the embodiment of the present disclosure can be applied to a mobile platform, and the distance detection device can be mounted on the platform body of the mobile platform. A mobile platform with a distance detection device can measure the external environment, such as measuring the distance between the mobile platform and an obstacle for obstacle avoidance and other purposes, and for two-dimensional or three-dimensional mapping of the external environment. In some embodiments, the mobile platform may include at least one of an unmanned aerial vehicle (UAV), a car, and a remote control car. When the distance detection device is applied to a UAV, the platform body may be the body of the UAV. When the distance detection device is applied to a car, the platform body may be the body of the car. When the distance detection device is applied to a remote control car, the platform body may be the body of the remote control car.

Since the light emitted by the light emitting module 810 can cover at least a part of the surface or even the entire surface of the object to be measure, correspondingly, the light is reflected after reaching the surface of the object, and the light reaching the reflected light receiving module 820 may not be a single point, but distributed in an array.

The reflected light receiving module 820 may include a photoelectric sensing cell array 821 and a lens 822. After the light reflected from the surface of the object to be measured reaches the lens 822, based on the principle of lens imaging, it can reach the corresponding photoelectric sensing unit in the photoelectric sensing cell array 821, and then be received by the photoelectric sensing unit, causing the photoelectric response of the photoelectric sensing process. Since in the process of the light being emitted until the photoelectric sensing unit receiving the reflected light, the light emitter 811 and the photoelectric sensing cell array 821 may be controlled by a clock control module to synchronize them (for example, a clock control module 830 shown in FIG. 10 is included in the distance detection device 800, or the clock control module may be outside the distance detection device 800). Therefore, based on the time of flight (TOF) principle, the distance between the point reached by the reflected light and the distance detection device 800 can be determined.

In addition, since the photoelectric sensing unit is not a single point, but a photoelectric sensing cell array 821, therefore, after data process by a data processing module (such as the data processing module 840 shown in FIG. 8 included in the distance detection device 800, or the data processing module may be outside the distance detection device 800), the distance information of all points in the field of view of the entire distance detection device can be obtained. That is, the point cloud data of the distance from the external environment that the detection device faces.

Based on the foregoing structure and working principle of the laser diode package module based on the embodiments of the present disclosure and the structure and working principle of the distance detection device based on the embodiment of the present disclosure, those skilled in the art can understand the structure and working principle of the electronic device based on the embodiments of the present disclosure. For brevity, detailed will not be repeated here.

Fifth Embodiment

With the development of science and technology, detection and measurement technologies are being applied in various fields. Lidar is a perception system of the outside world, which can learn the three-dimensional information of the outside world, and is no longer limited to the plane perception of the outside world, such as a camera. The principle is to actively emit laser pulse signals out, detect the reflected pulse signals, determined the distance of the measured object based on the time different between the emission and the reception, and combine the emission angle information of the light pulse to reconstruct the three-dimensional depth information.

An embodiment of the present disclosure provides a distance detection device, which can be used to measure the distance of an object to be detected to the detection device, and the orientation of the object to be detected relative to the detection device. In one embodiment, the detection device may include a radar, such as a lidar. The detection device can detect the distance between the detection device and the object to be detected by measuring the time of light propagation between the detection device and the object to be detected, that is, the time-of-flight (TGF).

Figure 11:
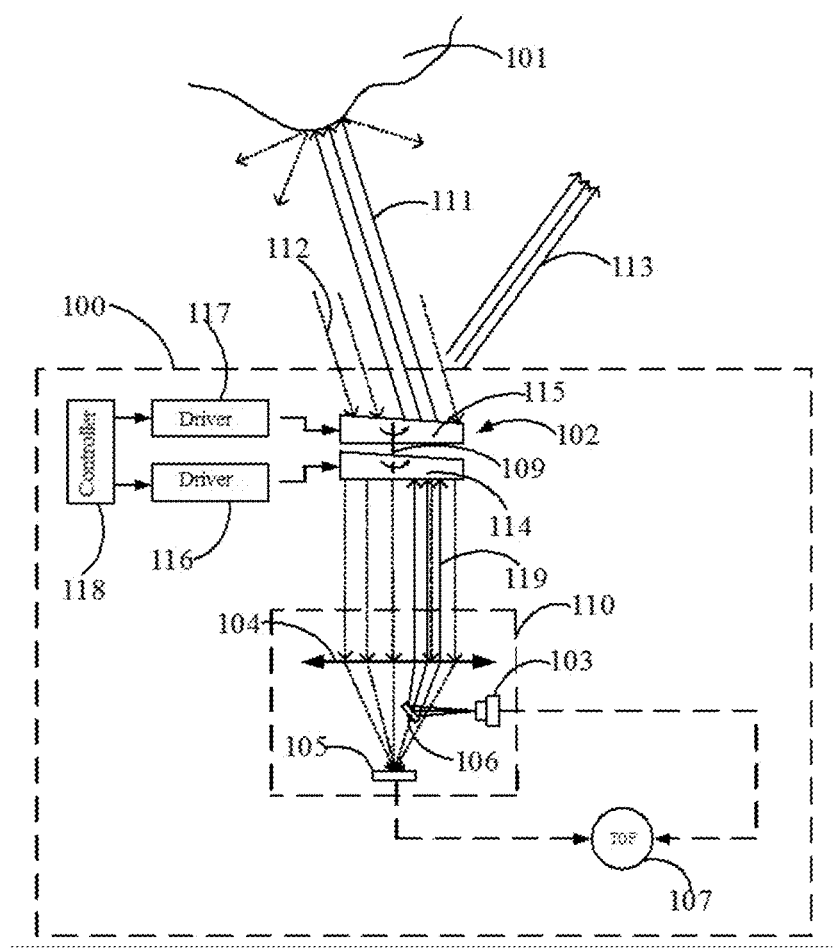
FIG. 11 is a schematic diagram of the distance detection device according to another embodiment of the present disclosure.

A coaxial optical path may be used in the distance detection device, that is, the light emitted by the detection device and the reflected light share at least a part of the optical path in the detection device. Alternatively, the detection may also use an off-axis optical path, that is, the light emitted by the detection device and the reflected light are transmitted along different optical paths in the detection device. FIG. 11 is a schematic diagram of the distance detection device of the present disclosure.

The distance detection device 100 includes an optical transceiver 110, and the optical transceiver 110 includes a light source 103, a collimating element 104, a detector 105, and an optical path changing element 106. The optical transceiver 110 may be configured to emit a light beam, receive the returned light, and convert the returned light into an electrical signal. The light source 103 may be used to emit a light beam. In one embodiment, the light source 103 may emit a laser beam. The light source may include the laser diode package module described in the first, second, and third embodiments, and may be configured to emit laser pulse in a direction at a certain angle with the first surface of the substrate of the laser diode package module, and the angle may be less than 90°. In some embodiments, the laser beam emitted by the light source 103 may be a narrow-bandwidth beam with a wavelength outside the visible light range. The collimating element 104 may be disposed outside the light-transmitting area of the laser package module, and may be configured to collimate the light emitted from the light-transmitting area (that is, to collimate the light beam emitted from the light source 103), and collimate the light beam emitted from the light source 103 into parallel light. The collimating element may also be used to condense at least a part of the returned light reflected by the objected to be detected. The collimating element 104 may be a collimating lens or other elements capable of collimating light beams.

The distance detection device 100 may further include a scanning module 102. The scanning module 102 may be placed on the exit light path of the optical transceiver 110. The scanning module 102 may be configured to change the transmission direction of a collimated light beam 119 emitted by the collimating element 104 and projecting it to the external environment, and projecting the returned light to the collimating element 104. The returned light may be collected by the detector 105 via the collimating element 104.

In one embodiment, the scanning module 102 may include one or more optical elements, such as a lens, a mirror, a prism, a grating, an optical phased array, or any combination of the foregoing optical elements. In some embodiments, the plurality of optical elements of the scanning module 102 may rotate around a common axis 109, and each rotating optical element may be used to continuously change the propagation direction of the incident light beam. In one embodiment, the plurality of optical elements of the scanning module 102 may rotate at different rotation speeds. In another embodiment, the plurality of optical elements of the scanning module 102 may rotate at substantially the same rotation speed.

In some embodiments, the plurality of optical elements of the scanning module may also rotate around different axes, or vibrate in the same direction, or vibrate in different directions, which is not limited here.

In one embodiment, the scanning module 102 may include a first optical element 114 and a driver 116 connected to the first optical element 114. The driver 116 may be configured to drive the first optical element 114 to rotate around the rotation axis 109, such that the first optical element 114 may change the direction of the collimated light beam 119. The first optical element 114 may project the collimated light beam 119 to different directions. In one embodiment, the angle between the direction of the collimated light beam 119 changed by the first optical element and the rotation axis 109 may change with the rotation of the first optical element 114. In one embodiment, the first optical element 114 may include a pair of opposite non-parallel surfaces through which the collimated light beam 119 may pass. In one embodiment, the first optical element 114 may include a wedge-angle prism to collimate the collimated light beam 119 for refracting. In one embodiment, the first optical element 114 may be coated with an anti-reflection coating, and the thickness of the anti-reflection coating may be equal to the wavelength of the light beam emitted by the light source 103, which can increase the intensity of the transmitted light beam.

In the embodiment shown in FIG. 11, the scanning module 102 includes a second optical element 115. The second optical element 115 may rotate around the rotation axis 109, and the rotation speed of the second optical element 115 may be different from the rotation speed of the first optical element 114. The second optical element 115 may be configured to change the direction of the light beam projected by the first optical element 114. In one embodiment, the second optical element 115 may be connected to another driver 117, and the driver 117 may be configured to drive the second optical element 115 to rotate. The first optical element 114 and the second optical element 115 may be driven by different drivers, such that the rotation speed of the first optical element 114 and the second optical element 115 may be different. As such, the collimated light beam 119 can be projected to different directions in the external space, and a larger spatial range can be scanned. In one embodiment, a controller 118 may control the driver 116 and the driver 117 to drive the first optical element 114 and the second optical element 115, respectively. The rotation speeds of the first optical element 114 and the second optical element 115 may be determined based on the area and pattern expected to be scanned in actual applications. The drivers 116 and 117 may include motors or other driving devices.

In one embodiment, the second optical element 115 may include a pair of opposite non-parallel surfaces through which the light beam may pass. The second optical element 115 may include a wedge-angle prism. In one embodiment, the second optical element 115 may be coated with an anti-reflection coating to increase the intensity of the transmitted light beam.

The rotation of the scanning module 102 may project light to different directions, such as a direction 111 and a direction 113, thereby scanning the space around the detection device 100. When the light in the direction 111 projected by the scanning module 102 hits an object to be detected 101, a part of the light may be reflected by the object to be detected 101 to the detection device 100 in a direction opposite to the direction 111 of the projected light. The scanning module 102 may receive a returned light 112 reflected by the object to be detected 101 and project the returned light 112 to the collimating element 104.

The collimating element 104 may be configured to converge at least a part of the returned light 112 reflected by the object to be detected 101. In one embodiment, an anti-reflection coating may be coated on the collimating element 104 to increase the intensity of the transmitted light beam. The detector 105 and the light source 103 may be disposed on the same side of the collimating element 104, and the detector 105 may be configured to convert at least a part of the returned light passing through the collimating element 104 into an electrical signal. In some embodiments, the detector 105 may include an avalanche photodiode. The avalanche photodiode is a highly sensitive semiconductor device that can convert an optical signal into an electrical signal using the photocurrent effect.

In some embodiments, the distance detection device 100 may include a measuring circuit, such as a TOF unit 107, which can be used to measure TOF to measure the distance of the object to be detected 101. For example, the TOF unit 107 can calculate the distance by the formula of t=2D/c, where D is the distance between the detection device and the object to be detected, c is the speed of light, and t is the total time it takes for the light to project from the detection device to the object to be detected and returned from the object to be detected to the detection device. The distance detection device 100 can determine the time t based on the time difference between the light emitted by the light source 103 and the returned light received by the detector 105, and then the distance D may be determined. The distance detection device 100 can also detect the position of the object to be detected 101 relative to the distance detection device 100. The distance and orientation detected by the distance detection device 100 can be used for remote sensing, obstacle avoidance, surveying and mapping, modeling, navigation, and the like.

In some embodiments, the light source 103 may include a laser diode, through which nanosecond laser light can be emitted. For example, the laser pulse emitted by the light source 103 may last for 10 ns, and the pulse duration of the returned light detected by the detector 105 may be substantially the same as the emitted laser pulse duration. Further, the laser pulse receiving time may be determined. For example, by detecting the rising edge time and/or falling edge time of the electrical signal pulse to determine the laser pulse receiving time. In some embodiments, multi-stage amplification may be performed on the electrical signal. As such, the distance detection device 100 can calculate the TOF by using the pulse receiving time information and the pulse sending time information, thereby determining the distance between the object to be detected 101 and the distance detection device 100.

Figure 12:
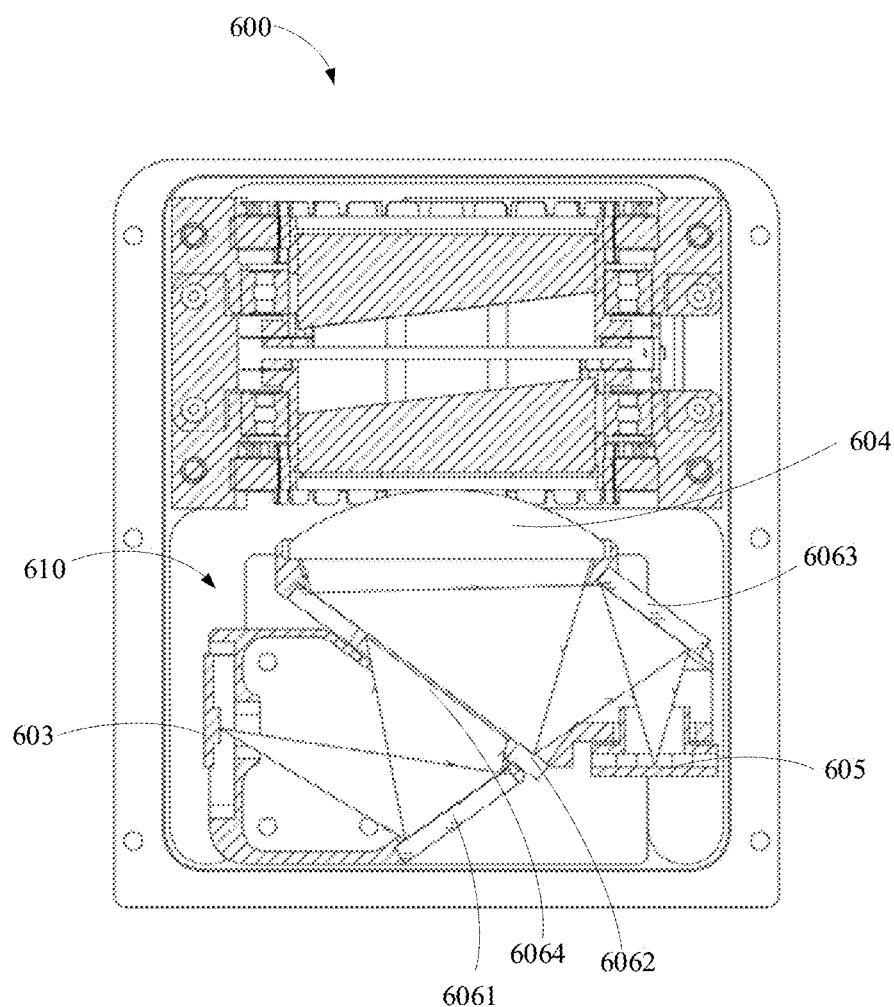
FIG. 12 is a schematic diagram of the distance detection device according to yet another embodiment of the present disclosure.

FIG. 12 is a schematic diagram of a distance detection device 600 according to another embodiment. The distance detection device 600 is similar to the distance detection device 100 shown in FIG. 11. Compared with the embodiment shown in FIG. 11, an optical transceiver 610 of the distance detection device 600 of the embodiment shown in FIG. 12 includes a plurality of optical path changing elements 6061-6063, which can change the optical path of the outgoing light beam and the optical path of the returned light emitted by a light source 603. In this way, a collimating lens 604 with a longer focal length may be used, and the light source 603 and a detector 605 may be equivalent to the focal position of the collimating lens 604 through the plurality of optical path changing elements 6061-6063. As such, the optical path can be folded by the optical path changing elements 6061-6063, such that the structure of the distance detection device 600 is compact, which is beneficial for the miniaturization.

The light source 603 may include the laser package module structure of the first, second, or third embodiment, and may be used to emit laser pulses at a certain angle with the first surface of the substrate of the laser diode package module, and the angle may be less than 90°. For example, the package module in the aforementioned first embodiment may further include a semiconductor with an anisotropic structure, and the reflective surface may specifically be an inclined surface prepared by etching the semiconductor using anisotropy. Alternatively, the reflective surface may include a reflective film coated on the inclined surface prepared by etching the semiconductor using anisotropy. The inclined surface prepared after etching may be used as the reflective surface, and the angle between the inclined surface and the bottom surface of the semiconductor may be substantially 54.74°. The emitted light of the laser diode die may be reflected by the reflective surface and then emitted through the light-transmitting area at an angle of substantially 19.48° to the normal of the substrate. That is, the laser pulse is emitted in a direction at a certain angle with the first surface of the substrate of the laser diode package module, and the angle is less than 90°. The collimating lens 604 may be disposed on the outside of the light-transmitting area of the laser diode package module, and may be configured to collimate the exit light emitted from the light-transmitting area. The collimating lens may also be configured to condense at least a part of the returned light reflected by the object to be detected. The laser diode package module may be positioned on one side of the center axis of the collimating lens 604, and the first surface of the substrate in the laser diode package module may be substantially parallel to the center axis of the collimating lens 604.

The plurality of optical path changing elements 6061-6063 may include mirrors, prisms, or other optical elements that can change the optical path. In the illustrated embodiment, the plurality of optical path changing elements 6061-6063 includes a first light path changing element 6061, a second light path changing element 6062, and a second light path changing element 6063. The first light path changing element 6061 is disposed on the outside of the light-transmitting area, facing the light source 603 and the collimating lens 604, and may be configured to change the light path of the outgoing light emitted from the light-transmitting area of the laser diode package module. As such, the laser pulse form the laser diode package module may incident on the collimating lens 604 in a direction substantially along the center axis of the collimating lens. For example, the first light path changing element 6061 may be a mirror. The first light path changing element 6061 is may be disposed on the center axis of the collimating lens, and may be configured to reflect the laser pulse emitted by the laser diode package module to a direction generally along the center axis of the collimating lens. Taking the case where the reflective surface is specifically an inclined surface prepared by etching the semiconductor using anisotropy as an example, the angle between the inclined surface prepared after etching and the bottom surface of the semiconductor may be substantially 54.74°, and the emitted light of the laser diode die may be reflected by the reflective surface and then emitted through the light-transmitting area at an angle of substantially 19.48° to the normal of the substrate. Subsequently, the light may be irradiated on the first light path changing element 6061, and reflected by the first light path changing element 6061 to a direction generally along the center axis of the collimating lens. The light source 603 may emit a light beam diagonally downward and the light beam may reach the first light path changing element 6061, and the first light path changing element 6061 may reflect the light beam toward the collimating lens 604.

For example, the mirror of the first light path changing element 6061 may be placed obliquely with respect to the optical axis of the collimating lens 604, that is, deviating from the optical axis of the collimating lens 604, facing the light source 603 and the collimating lens 604, and may be configured to reflect the exit light emitted from the light-transmitting area to the collimating lens 604. That is, the light source 603 may emit a light beam diagonally downward and the light beam may reach the first light path changing element 6061, and the first light path changing element 6061 may reflect the light beam toward the collimating lens 604.

A light-transmitting area, such as a through hole 6064 may be disposed at the center of the second light path changing element 6062. The through hole 6064 may be substantially posited in the middle of the second light path changing element 6062. The through hole 6064 may have a trapezoidal shape. In some embodiments, the through hole 6064 may be rectangular, circular, or other shapes. Continue to refer to FIG. 12, the second light path changing element 6062 is disposed between the first light path changing element 6061 and the collimating lens 604, and faces the collimating lens 604. The optical axis of the collimating lens 604 may pass through the through hole 6064. The light beam reflected by the first light path changing element 6061 may pass through the through hole 6064 of the second light path changing element 6062, project to the collimating lens 604, and be collimated by the collimating lens 604.

In the illustrated embodiment, the detector 605 is positioned on the other side of the distance detection device 600 relative to the light source 603, and may be configured to convert the received optical signal into an electrical signal. The electrical signal may be used to measure the distance between the object to be detected and the distance detection device. The returned light converged by the collimating lens 604 may pass through the second light path changing element 6062 and the third light path changing element 6063, and converge to the detector 605. The third light path changing element 6063 may be positioned outside the collimating lens 604, above the detector 605 close to the collimating lens 604, facing the second light path changing element 6062 and the detector 605, and may be respectively disposed opposite to the second light path changing element 6062 and the detector 605. The returned light combined by the collimating lens 604 may be reflected to the third light path changing element 6063 through the second light path changing element 6062, and then the third light path changing element 6063 may reflect the returned light to the detector 605.

A person having ordinary skill in the art can appreciate that units and algorithms of the disclosed methods and processes may be implemented using electrical hardware, or a combination of electrical hardware and computer software. Whether the implementation is through hardware or software is to be determined based on specific application and design constraints. A person of ordinary skill in the art may use different methods to realize different functions for each specific application. Such implementations fall within the scope of the present disclosure Those skilled in the art should realize that the present disclosure can be implemented electronic hardware, or a combination of computer software and electronic hardware. Whether these functions are performed by hardware or software may depend on the specific applications and design constraints. Those skilled in the art can use different methods to achieve the described functions for each of the specific applications, but such achievement should not be considered to exceed the scope of the present disclosure.

In the several embodiments provided by the present disclosure, it should be understood that the disclosed apparatus and method may be implemented in other manners. For example, the apparatus embodiments described above are merely illustrative. For example, the unit division is merely logical function division and there may be other division in actual implementation. For example, multiple units or components may be combined or integrated into another system, or some features can be omitted or not be executed.

In the specification provided herein, a plenty of particular details are described. However, it can be appreciated that embodiments of the present disclosure may be practiced without these particular details. In some embodiments, well known methods, structures and technologies are not illustrated in detail so as not to obscure the understanding of the specification.

Similarly, it shall be appreciated that in order to simplify the present disclosure and help the understanding of one or more of all the inventive aspects, in the above description of the exemplary embodiments of the present disclosure, sometimes individual features of the invention are grouped together into a single embodiment, figure or the description thereof. However, the disclosed methods should not be construed as reflecting the following intention, namely, the claimed invention claims more features than those explicitly recited in each claim. More precisely, as reflected in the following claims, an aspect of the invention lies in being less than all the features of individual embodiments disclosed previously. Therefore, the claims complying with a particular implementation are hereby incorporated into the particular implementation, wherein each claim itself acts as an individual embodiment of the present disclosure.

Those skilled in the art can understand that in additional to mutual exclusion between the features, all the features disclosed in the specification (including the accompanying claims, abstract and drawings) and all the procedures or units of any method or device disclosed as such may be combined employing any combination. Unless explicitly stated otherwise, each feature disclosed in the specification (including the accompanying claims, abstract and drawings) may be replaced by an alternative feature providing an identical, equal or similar objective.

Furthermore, it can be appreciated to the skilled in the art that although some embodiments described herein comprise some features and not other features comprised in other embodiment, a combination of features of different embodiments is indicative of being within the scope of the invention and forming a different embodiment. For example, in the following claims, any one of the claimed embodiments may be used in any combination.

Each embodiment of the present disclosure may be implemented by hardware or implemented by a software module operating on one or more processors or implemented by a combination of the hardware and the software module. A person skilled in the art should understand that partial or complete functions of some or all components in the device for data matching according to the embodiment of the present disclosure may be implemented by using a microprocessor or a digital signal processor (DSP) in practice. The present disclosure may be further implemented as a program of a device or apparatus (such as a computer program and a computer program product) to be configured to partially or completely perform the method described here. The program realizing the present disclosure may be stored in a computer readable medium, or may have one or more signal types. The signals may be downloaded from an Internet website or provided by a carrier signal or provided in any other form.

It should be noted that the embodiments above are illustrations rather than limitations on the present disclosure; moreover, a person skilled in the art may design substituting embodiments in case of not deflecting from scope of accompanying claims. In the claims, any reference signs in brackets shall not be construed as a limitation on the claims. The present disclosure may be implemented by hardware including a plurality of different elements as well as a properly programmed computer. In a claim listing a plurality of apparatus units, several of the apparatus units may be specifically implemented by a same hardware item. Use of words "first", "second", "third", and the like, does not represent any sequence preference. The words may be explained as names.

Other embodiments of the present disclosure will be apparent to those skilled in the art from consideration of the specification and practice of the embodiments disclosed herein. It is intended that the specification and examples be considered as example only and not to limit the scope of the present disclosure, with a true scope and spirit of the invention being indicated by the following claims. Variations or equivalents derived from the disclosed embodiments also fall within the scope of the present disclosure.

What is claimed is:

1. A laser diode package module, comprising:
a substrate including a first surface;
a semiconductor mounted on the first surface;
a cover disposed on the first surface of the substrate;
an accommodation space formed between the substrate and the cover;
a laser diode die disposed in the accommodation space; and
a reflective surface disposed in the accommodation space for outputting light of the laser diode die reflected by the reflective surface and transmitted through a light-transmitting area, wherein;
the light-transmitting area is at least partially disposed on a surface of the cover opposite the substrate; and
notches or shallow grooves are disposed at sharp corners of a bottom surface of the semiconductor.

2. The package module of claim 1, wherein:
the emitted light of the laser diode die is reflected by the reflective surface and transmitted through the light-transmitting area in a direction substantially perpendicular to the first surface of the substrate.

3. The package module of claim 1, wherein:
the semiconductor has an anisotropic structure; and
the reflective surface is an inclined surface prepared by anisotropy etching, or the reflective surface includes a reflective film coated on the inclined surface prepared by anisotropy etching.

4. The package module of claim 3, wherein:
the semiconductor includes a first part positioned at a bottom and a second part positioned on a partial surface of the first part, the reflective surface being disposed on one or more inclined surface of the second part.

5. The package module of claim 4, wherein:
the laser diode die is disposed on a surface of the first part outside the reflective surface, and the exit surface of the laser diode die is disposed opposite the reflective surface.

6. The package module of claim 4, wherein:
the reflective film includes a metal layer, the metal layer on the reflective surface further extending to cover a part of an exposed surface of the first part outside the reflective surface; and the part of the metal layer positioned on the surface of the first part is used for electrical connection with the bottom surface of the laser diode die.

7. The package module of claim 6, wherein:
the laser diode die covers a part of the surface of the reflective film on the surface of the first part, and the reflective film is electrically connected to a pad on the substrate through a wire to lead out an electrode on the bottom surface of the laser diode die.

8. The package module of claim 1, further comprising:
two or more obliquely disposed reflective surfaces disposed on the package module, wherein
each reflective surface is disposed opposite an exit surface of one or more of the laser diode dies, such that an exit light of each laser diode die is reflected by the reflective surface and emitted through the light-transmitting area.

9. The package module of claim 8, wherein:
each of the reflective surfaces is disposed opposite the exit surfaces of two or more laser diode dies disposed in parallel, such that the exit light of each laser diode is reflected by the reflective surface and emitted through the light-transmitting area.

10. The package module of claim 8, wherein:
the semiconductor has an anisotropic structure; and
the two or more obliquely disposed reflective surfaces are disposed on different inclined surfaces prepared by anisotropy etching.

11. The package module of claim 10, wherein:
the two obliquely disposed reflective surfaces are disposed on two symmetrically disposed and opposite oblique surfaces on the semiconductor.

12. The package module of claim 8, wherein:
the package module includes two or more semiconductors with an anisotropic structure, the semiconductor is one of the two or more semiconductors; and
the two or more obliquely disposed reflective surfaces are respectively disposed on inclined surfaces prepared by anisotropy etching.

13. The package module of claim 1, wherein:
the notches are cuts formed by removing a part of bottom sharp corners of the semiconductor; and the shallow grooves are disposed at edges of the sharp corners of the bottom surface of the semiconductor and extend from the bottom surface of the semiconductor to a depth of a recessed part of a top surface of the semiconductor.

14. The package module of claim 1, further comprising:
a collimating element for reducing a divergence angle of a light beam in a fast axis direction, wherein
the collimating element is disposed between the laser diode die and the reflective surface, such that the emitted light from the laser diode die reaches the reflective surface after passing through the collimating element.

15. The package module of claim 14, wherein:
the collimating element is mounted on the first surface of the substrate.

16. The package module of claim 14, wherein:
the collimating element is a cylindrical lens, and a curved surface of the cylindrical lens is opposite the exit surface of the laser diode die, such that the exit light of the laser diode die irradiates onto the curved surface of the cylindrical lens.

17. A distance detection device, comprising:
a laser diode package module including:
a substrate including a first surface;
a semiconductor mounted on the first surface;
a cover disposed on the first surface of the substrate;
an accommodation space formed between the substrate and the cover;
a laser diode die disposed in the accommodation space;
a reflective surface disposed in the accommodation space for outputting light of the laser diode die reflected by the reflective surface and transmitted through a light-transmitting area, the light-transmitting area being partially disposed on a surface of the cover opposite the substrate;
a collimating lens disposed outside the light-transmitting area for collimating the light emitted from the light-transmitting area; and
a first optical path changing element disposed outside the light-transmitting area for changing an optical path of an outgoing light emitted from the light-transmitting area, such that the laser pulse from the laser diode package module is incident on the collimating lens in a direction substantially along a center axis of the collimating lens, wherein:
the laser diode package module emits laser pulses at an angle from the first surface of the substrate of the laser diode package module, the angle being less than 90 degrees; and
notches or shallow grooves are disposed at sharp corners of a bottom surface of the semiconductor.

18. The distance detection device of claim 17, wherein the first optical path changing element includes:
a first reflector, the first reflector deviating from an optical axis of the collimating lens for reflecting the outgoing light emitted from the light-transmitting area to the collimating lens.

19. The distance detection device of claim 18, wherein:
the laser diode package module is positioned on one side of the center axis of the collimating lens, and the first surface of the substrate in the laser diode package module is substantially parallel to the center axis of the collimating lens; and
the first reflector is positioned on the center axis of the collimating lens for reflecting the laser pulse emitted by the laser diode package module to a directly substantially along the center axis of the collimating lens.

20. The distance detection device of claim 18, wherein:
the collimating lens condenses a part of a returned light reflected by an object; and
the laser emitting device further includes:
a second reflector, a third reflector, and a detector with the light-transmitting area;
the second reflector being disposed between the collimating lens and the first reflector, a light beam reflected by the first reflector passing through the second reflector, the second reflector reflecting the returned light condensed by the collimating lens to the third reflector;
the third reflector being respectively disposed opposite the second reflector and the detector for reflecting the returned light reflected by the second reflector to the detector; and
the detector converting a received optical signal into an electrical signal, and the electrical signal is used to measure a distance between the object and the distance detection device.

21. A laser diode package module, comprising:
a substrate including a first surface;
a semiconductor mounted on the first surface of the substrate;
a cover disposed on the first surface of the substrate;
an accommodation space formed between the substrate and the cover;
a laser diode die disposed in the accommodation space;
a reflective surface disposed in the accommodation space for outputting light of the laser diode die reflected by the reflective surface and transmitted through a light-transmitting area, wherein:
the light-transmitting area is at least partially disposed on a surface of the cover opposite the substrate; and
the semiconductor includes a first part positioned at a bottom and a second part positioned on a partial surface of the first part, the reflective surface being disposed on one or more inclined surface of the second part.

\* \* \* \* \*